(12) United States Patent
Watanabe et al.

(10) Patent No.: US 7,824,497 B2
(45) Date of Patent: Nov. 2, 2010

(54) APPARATUS FOR MANUFACTURING MAGNETIC RECORDING DISK, AND IN-LINE TYPE SUBSTRATE PROCESSING APPARATUS

(75) Inventors: Naoki Watanabe, Tokyo (JP);
Nobuyoshi Watanabe, Tokyo (JP);
Kazunori Tani, Tokyo (JP); Shinji Furukawa, Tokyo (JP); Hiromi Sasaki, Tokyo (JP); Osamu Watabe, Tokyo (JP)

(73) Assignee: Canon Anelva Corporation, Tokyo (JP)

( * ) Notice: Subject to any disclaimer, the term of this patent is extended or adjusted under 35 U.S.C. 154(b) by 0 days.

(21) Appl. No.: 12/037,021

(22) Filed: Feb. 25, 2008

(65) Prior Publication Data

US 2008/0216744 A1    Sep. 11, 2008

Related U.S. Application Data

(62) Division of application No. 11/007,186, filed on Dec. 9, 2004, now abandoned, which is a division of application No. 10/405,487, filed on Apr. 3, 2003, now abandoned, which is a division of application No. 09/774,887, filed on Feb. 1, 2001, now Pat. No. 6,572,934.

(30) Foreign Application Priority Data

Feb. 1, 2000    (JP)    ............................. 2000-024334

(51) Int. Cl.
*C23C 16/00*    (2006.01)
*C23C 14/00*    (2006.01)

(52) U.S. Cl. ............. 118/719; 156/345.31; 156/345.32; 204/298.23; 204/298.25; 414/217

(58) Field of Classification Search .................. 118/719; 156/345.31, 345.32; 414/935–941
See application file for complete search history.

(56) References Cited

U.S. PATENT DOCUMENTS

| 4,405,435 A | 9/1983 | Tateishi et al. ......... 204/298.25 |
| 5,618,639 A | 4/1997 | Ohno et al. | |

(Continued)

FOREIGN PATENT DOCUMENTS

JP              61227230 A       10/1986

(Continued)

OTHER PUBLICATIONS

Japanese language office action and its English language translation for corresponding Japanese application 2000024334 lists the references above.

(Continued)

*Primary Examiner*—Karla Moore
(74) *Attorney, Agent, or Firm*—DLA Piper LLP (US)

(57) ABSTRACT

An apparatus for manufacturing a magnetic recording disk includes a magnetic-film deposition chamber in which a magnetic film for a recording layer is deposited on a substrate; a lubricant-layer preparation chamber in which a lubricant layer is prepared on the substrate in vacuum; and a cleaning chamber in which the substrate is cleaned in vacuum after the magnetic-film deposition in the magnetic-film chamber and before the lubricant-layer preparation in the lubricant-layer chamber. The apparatus may further include a transfer system that transfers the substrate from the cleaning chamber to the lubricant-layer preparation chamber without exposing the substrate to the atmosphere.

8 Claims, 19 Drawing Sheets

U.S. PATENT DOCUMENTS

| | | | |
|---|---|---|---|
| 5,695,564 A | 12/1997 | Imahashi | 118/719 |
| 5,846,328 A | 12/1998 | Aruga et al. | |
| 5,924,833 A * | 7/1999 | Conboy et al. | 414/217 |
| 6,027,618 A | 2/2000 | Aruga et al. | |
| 6,183,564 B1 * | 2/2001 | Reynolds et al. | 118/719 |

FOREIGN PATENT DOCUMENTS

| | | |
|---|---|---|
| JP | 64025319 A | 1/1989 |
| JP | 02154321 A | 6/1990 |
| JP | 03071426 A | 3/1991 |
| JP | 04067429 A | 3/1992 |
| JP | 06103573 A | 4/1994 |
| JP | 07014153 A | 1/1995 |
| JP | 08063747 A | 3/1996 |
| JP | 08221746 A | 8/1996 |
| JP | 09097426 A | 4/1997 |
| JP | 09097428 A | 4/1997 |
| JP | 11229150 A | 8/1999 |

OTHER PUBLICATIONS

Japanese language office action and its English language translation for corresponding Japanese application 2008193577 lists the reference above, dated Feb. 2, 2010.

* cited by examiner

APPARATUS FOR MANUFACTURING MAGNETIC RECORDING DISK, AND IN-LINE TYPE SUBSTRATE PROCESSING APPARATUS

CROSS REFERENCE TO RELATED APPLICATION

This application is a divisional of application Ser. No. 11/007,186, filed on Dec. 9, 2004, which is a divisional of application Ser. No. 10/405,487, filed on Apr. 3, 2003, which is a divisional of application Ser. No. 09/774,887, filed on Feb. 1, 2001, now U.S. Pat. No. 6,572,934, the entire contents of which are incorporated herein by reference. This application also claims benefit of priority under 35 USC 119 to Japanese Patent Application No. 2000-024334 filed Feb. 1, 2000, the entire contents of which are incorporated herein by reference.

BACKGROUND OF THE INVENTION AND RELATED ART STATEMENT

This invention relates to an apparatus for manufacturing magnetic recoding disks. Especially, this invention relates to an apparatus performing a manufacturing method including a step of removing protrusions on a substrate and a step of forming a lubricant film on the substrate.

The manufacture of a magnetic recording disk such as a hard disk is roughly divided into former steps and latter steps. The former steps include deposition of an underlying film, deposition of a magnetic film for a recording layer, and deposition of an overcoat. The latter steps include preparation of a lubricant layer and other required steps. The lubricant layer is prepared considering contact of a magnetic head onto the disk in read-out.

The preparation of the lubricant layer is carried out by a following procedure.

To begin with, a substrate is taken out to the atmosphere after deposition steps because thin-films such as the magnetic film for a recording layer are usually deposited in a vacuum chamber. Then, burnishing is carried out to remove contaminants adhering to the substrate and to remove protrusions formed on the substrate during the film depositions. The burnishing is a step of removing the protrusions and the contaminants from the substrate by rubbing it with a tape-shaped polishing member. The "contaminant" in this specification means materials that may contaminate a substrate in general, which is a gas, ions, molecules, particles or other substances.

The lubricant layer is prepared after the burnishing. As lubricant, fluorine lubricant such as perfluoropolyether (PFPE) is used. Such lubricant is diluted with solvent for improving uniformity. The diluted lubricant is coated onto the substrate by such method as a dipping method where the substrate is dipped into the diluted lubricant, or a spin-coating method where the lubricant is dropped onto the substrate when it is spun.

"Substrate" means a board that consists a magnetic recording disk in this specification. "Surface of substrate" may mean a surface of a film or layer when a film deposition or a layer preparation has already been carried out onto the substrate.

Recent improvement of recording density in magnetic recording disks is remarkable. For example, in hard disks it is becoming 20 gigabit/inch2 in the year 2000 and 40 gigabit/inch2 in the year 2001. One of factors that enable the improvement of the recording density is to reduce a spacing. FIG. 19 shows a view explaining the spacing.

In FIG. 19, the spacing in the case of hard disks is explained as an example. As shown in FIG. 19, a hard disk has a structure where a recording layer 91 is prepared on a substrates 9, an overcoat 92 is deposited on the recording layer 91, and a lubricant layer 93 is prepared on the overcoat 92. A magnetic head for writing and reading information is located at a position slightly apart from the surface of the hard disk. The spacing, which is designated by "S" in FIG. 19, means distance between a write-readout device element 900 of the magnetic head and the recording layer 91 of the hard disk. A distance between the write-readout device element 900 and the lubricant layer 93 is called a "flying height", which is designated by "FH" in FIG. 19. It is important to make the spacing S small in improving the recording density.

As the spacing S becomes smaller, demands to the manufacturing process have been becoming severer by years. For reducing the spacing S, it is required not only to reduce the flying height FH, which is about 10 to 20 nm in a typical hard disk drive (HDD) currently on sale in the market, but also required to make a thickness of the overcoat 92 and a thickness of the lubricant layer 93 thinner. As thickness of the overcoat 92 is made thinner, it is required to deposit a more compact and harder film as the overcoat 92. As the thickness of overcoat 92 is made thinner, a demand for thickness uniformity of the lubricant layer 93 becomes severer as well as a demand for enhancing an adhesion strength of the lubricant layer 93 becomes severer.

With the above described points in the background, a method for depositing the overcoat 9 has been shifting from a conventional sputtering method to a chemical vapor deposition (CVD) method. Usually a carbon film is deposited as the overcoat 92. By the CVD method, it is enabled to deposit a carbon film called a "diamond-like carbon" (DLC) film. The DLC film is known as a hard, compact and stable carbon film even when its thickness is small. This is the reason why the method has been shifting to the CVD method.

However, the contaminants of gases or ions may adhere to the overcoat 92 under influence of residual gases when it is deposited by the CVD method. In addition, minute protrusions are easily formed on the overcoat 92 in the CVD method, resulting from abnormal film growth. If the lubricant layer 93 is prepared over the overcoat 92 on which the contaminants or the protrusions exist, there easily arise problems such as the adhesion strength of the lubricant layer 93 may decrease, and the thickness of the lubricant layer 93 may lose uniformity.

The adhesion strength of the lubricant layer 93 is enhanced when terminal groups of macromolecules composing the lubricant are bonded sufficiently with carbons in the overcoat 92. For making the adhesion strength higher, it is preferable that the macromolecules are bonded with carbons in the surface of the overcoat 92 at one of or both terminal groups. On the other hand, it is desirable that a degree of freedom of the macromolecules is high at a portion adjacent to the surface of the lubricant layer 93, on purpose of prevention the write-readout device element 900 of the magnetic head from chucking with the disk. In short, both terminal groups are preferably not bonded near the surface of the lubricant layer.

A macromolecule bonded with a carbon at one of or both terminal groups is hereinafter called a "bonded lub". A macromolecule not bonded with a carbon at either of terminal groups is hereinafter called a "free lub". A thickness ratio of the bonded lub layer against the whole lubricant layer 93 is hereinafter called a "bonded ratio". Though an optimum bonded ratio has been supposed about 20-30% so far, a demand for accuracy of the bonded ratio tends to be severer as the lubricant layer 93 is made thinner.

For obtaining the demanded bonded ratio, it has been attempted to carry out treatment for controlling the bonds of the terminal groups after the lubricant-layer preparation. In this treatment, thermal energy or light energy is applied to the lubricant layer 93, thereby controlling the bonds of the terminal groups. This treatment is hereinafter called "post-preparation treatment".

However, when the overcoat 92 is exposed to the atmosphere after the deposition, many contaminants of gases or ions in the atmosphere are adsorbed with the surface of the overcoat 92 because the surface has been chemically activated. As a result, when the lubricant layer 93 is prepared, a contaminated layer may be formed between the lubricant layer 93 and the overcoat 92. If the contaminated layer is formed, it may become difficult to obtain an accurate bonded ratio by the post-preparation treatment. For preventing these problems, equipment that reduces the contaminants is required. Including such a point, the current situation is that huge investment is inevitable for coordinating manufacture environment.

An object of the invention is to solve the described problems in the manufacturing process, which have been brought from the reduction of the spacing.

SUMMARY OF THE INVENTION

To accomplish this object, the invention presents a method and an apparatus for manufacturing a magnetic recording disk, where steps from magnetic-film deposition to lubricant-layer preparation are carried out without breaking vacuum. The invention also presents a method and an apparatus for manufacturing a magnetic recording disk, where a substrate is cleaned prior to lubricant-layer preparation. The invention also presents a method and an apparatus for manufacturing a magnetic recording disk, where burnishing is carried out in vacuum after magnetic-film deposition. The invention also presents a method and an apparatus for manufacturing a magnetic recording disk, where post-preparation treatment to coordinate adhesive strength and surface lubricity of a lubricant layer is carried out in vacuum. The invention also presents an in-line type substrate processing apparatus comprising a plurality of vacuum chambers provided along each of a plurality of circumventive transfer paths, a connection transfer path connecting at least two of the circumventive transfer paths, and a transfer system that transfers a substrate to be processed along the circumventive transfer paths and the connection transfer path without exposing the substrate to the atmosphere.

DETAILED DESCRIPTION OF PREFERRED EMBODIMENTS

Preferred embodiments of this invention are described as follows.

Figure 1:
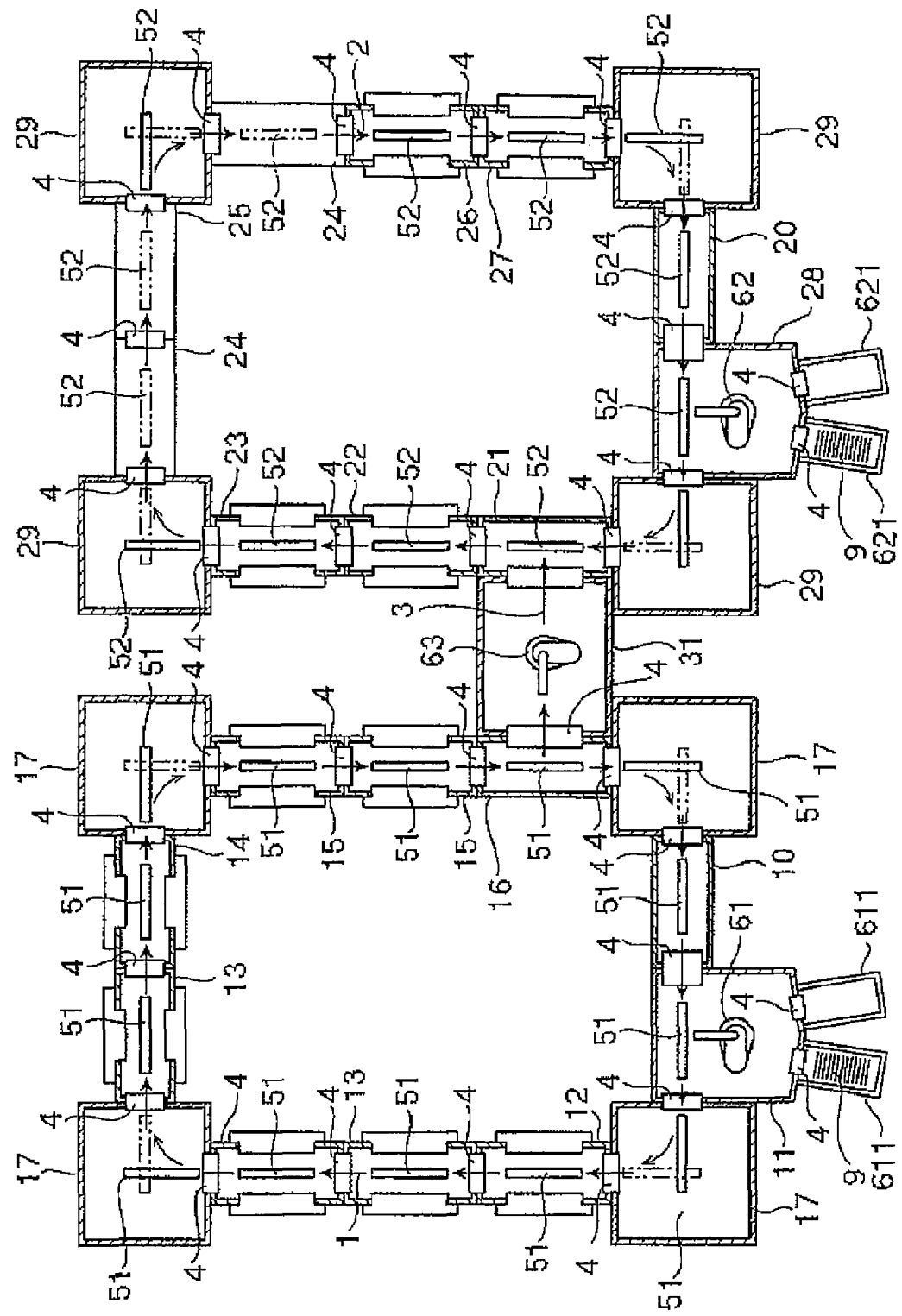
FIG. 1 shows a schematic plane view of a magnetic recording disk manufacturing apparatus of the first embodiment of the invention.

FIG. 1 shows a schematic plane view of a magnetic recording disk manufacturing apparatus of the first embodiment of the invention. The first point characterizing the first embodiment is that the former steps such as preparation of a recording layer and the latter steps such as preparation of a lubricant layer can be carried out through only one apparatus. The second point characterizing the first embodiment is that each step from the recording layer preparation to the lubricant-layer preparation can be carried out continuously in vacuum, i.e. without taking out a substrate 9 to the atmosphere.

In the concrete, the apparatus shown in FIG. 1 is an in-line type apparatuses where a plurality of vacuum chambers 10-17, 20-29 is arranged along transfer paths 1,2 of the substrates 9. Each vacuum chamber 10-17, 20-29 is an airtight chamber pumped by a respective or a common pumping system (not shown). In each boundary of the vacuum chambers 10-17, 20-29, a gate valve 4 is provided.

A plurality of the vacuum chambers 10-17, 20-29 is divided into the first group of the chambers 10-17 arranged along the first rectangular transfer path (hereinafter, the first transfer path) 1, and the second group of the chambers 20-29 arranged along the second rectangular transfer path (hereinafter, the second transfer path) 2. The third transfer path 3 connecting the first transfer path 1 and the second transfer path 2 is provided. A vacuum chamber 31 is also provided on the third transfer path 3. This vacuum chamber 31 on third transfer path 3 is connected airtightly with one vacuum chamber 16 of the first group and one vacuum chamber 21 of the second group so that the substrate 9 can be transferred from the first transfer path 1 to the second transfer path 2 without being taken out to the atmosphere.

In the vacuum chambers 10-17 of the first group, steps from the underlying-film deposition to the overcoat deposition are carried out. In the vacuum chambers 20-29 of the second group, steps after the overcoat deposition to the lubricant-layer preparation are carried out.

A composition of a transfer system that transfers the substrate 9 through the first, the second and the third transfer paths 1,2,3 is described as follows. The transfer system is mainly composed of the first circulation means that circulates the first substrate holder 51 holding the substrate 9 along the first transfer path 1, a loading robot 61 that loads the substrate 9 to the substrate holder 51 on the first transfer path 1, the second circulation means that circulates the second substrate holder 52 holding the substrate 9, an unloading robot 62 that unloads the substrate 9 from the substrate holder 52 on the second transfer path 2, and a shifting robot 63 that unloads the substrate 9 from the first substrate holder 51 and loads it to the second substrate holder 52.

The loading robot 61, the unloading robot 62 and the shifting robot 63 are all the same robot basically, which comprises a multi-articulation arm for holding the substrate 9 at a tip of the arm. The first and the second substrate holders 51,52 are also the same composition. The first and the second circulation means are basically the same composition as well. As an example, the compositions of the first substrate holder 51 and the first circulation means are described as follows.

Figure 2:
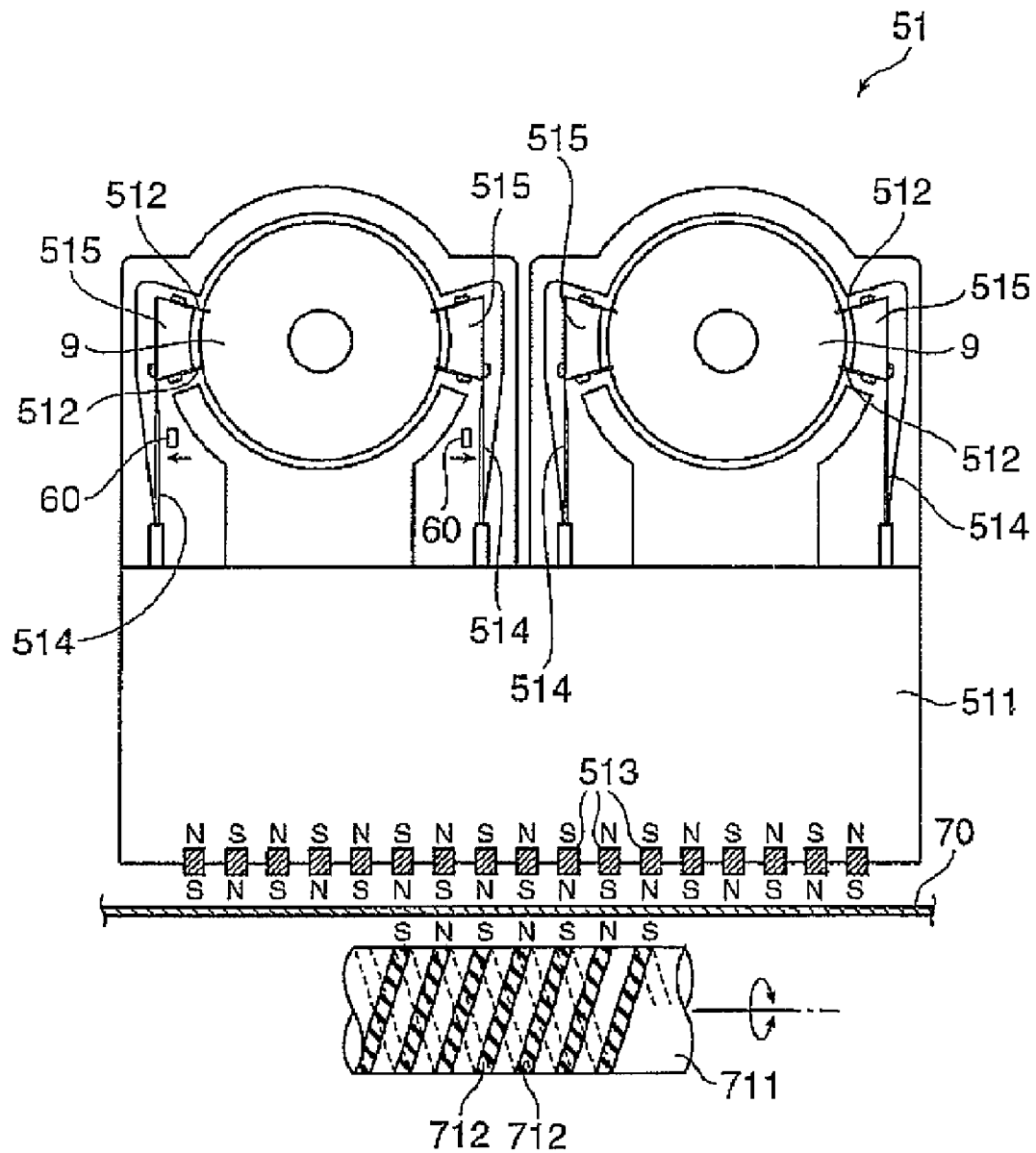
FIG. 2 shows a schematic front view of the first substrate holder 51 and a linear transfer mechanism in the apparatus shown in FIG. 1.
Figure 3:
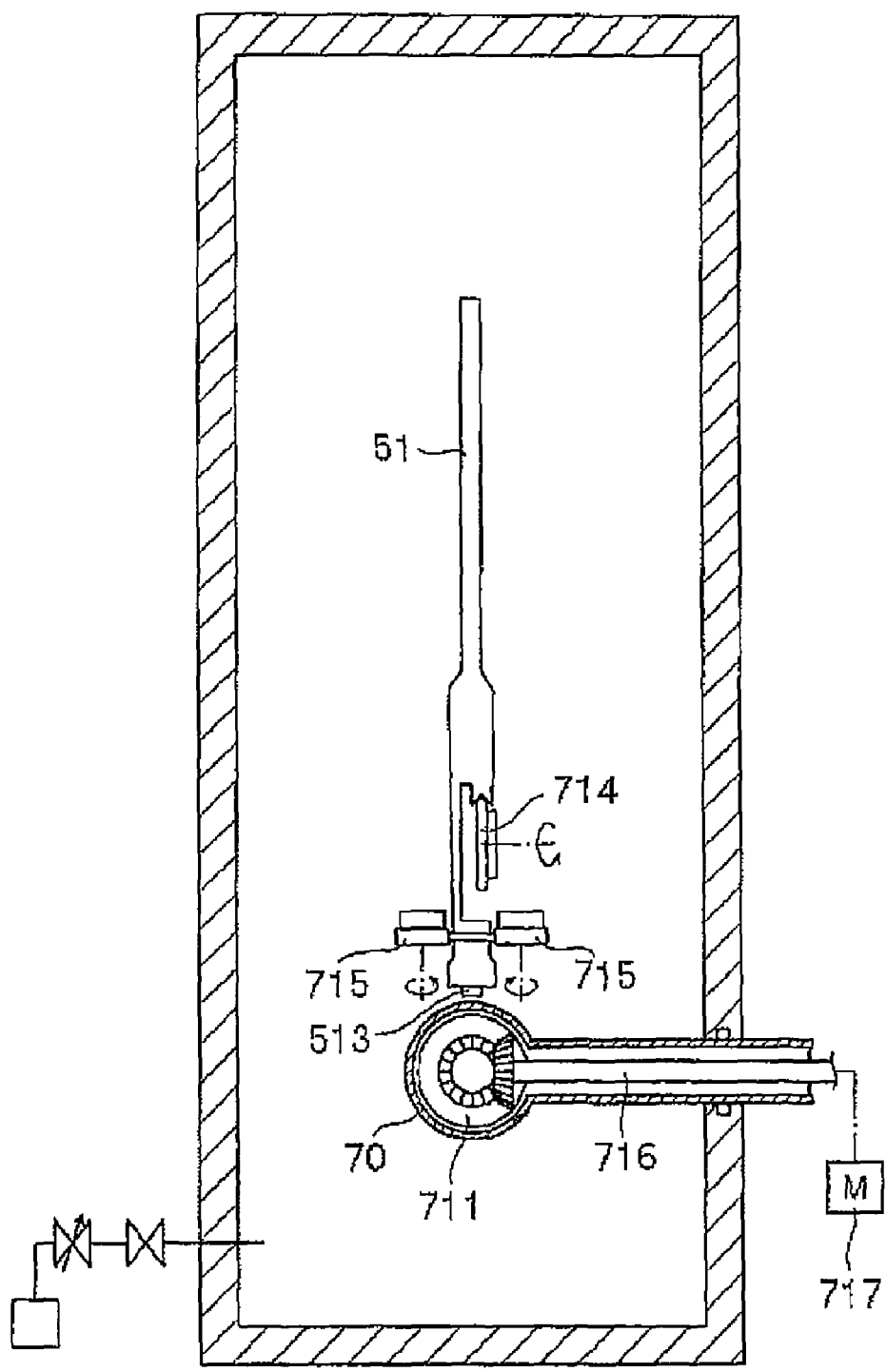
FIG. 3 shows a schematic side cross-sectional view of the first substrate holder 51 and the linear transfer mechanism in the apparatus shown in FIG. 1

The first circulation means is mainly composed of a linear movement mechanism that moves the first holders 51 linearly on the first transfer path 1, and a direction-conversion mechanism that converts a transfer direction of the first substrate holder 51. The compositions of the first substrate holder 51 and the linear movement mechanism are described as follows using FIG. 2 and FIG. 3. FIG. 2 and FIG. 3 show the first substrate holder 51 and the linear movement mechanism employed in the apparatus shown in FIG. 1. FIG. 2 shows a front view of them and FIG. 3 shows a side cross-sectional view of them.

The first substrate holder 51 is mainly composed of a main board 511 and pallets 512 fixed with the main board 511. Eight pallets 512 are provided. Each group of four pallets 512 holds one substrate 9. Therefore, in this embodiment, the first substrate holder 51 simultaneously holds two substrates 9. As shown in FIG. 2, the main board 511 has two cutouts. A shape of each cutout is nearly circle and a little larger than the substrate 9. In each group of the pallets 512, two pallets 512 are fixed at one side edge of each cutout. The other two pallets 512 are fixed the other side edge of each cutout. The substrate 9 is sandwiched between two couples of the pallets 512.

The main board 511 has another cutout elongated downward from both sides of each nearly circular cutout. A vertically elongated spring band 514 is provided in each cutout. A mount 515 is fixed at the top of each spring band 514. As shown in FIG. 2, the mount 515 is a nearly trapezoid-shaped plate. The pallet 512 is fixed on the top and the bottom of the mount 515 by screwing. The edge of each pallet 512 is V-shaped in which the edge of the substrate 9 is inlet.

Each robot 61, 62, 63 has a couple of levers 60 that curve a couple of spring bands 514 against elasticity so that the pallets 512 shift away from the nearly circular cutout. A loading operation of the substrate 9 onto the first substrate holder 51 is described as follows. First, the levers 60 curve the spring bands 514. In this state, the substrate 9 is located at the center of the nearly circular cutout. Afterward, the levers 60 are returned to the initial position so that the spring bands 12 can restore the initial posture on elasticity. As a result, the substrate 9 is caught by the four pallets 512. By repeating the same operation so that the other substrate 9 is caught by the other four pallets 512, two substrates 9 are held by the first substrate holder 51. The two substrates 9 are unloaded from the first substrate holder 51 by an operation quite reverse to this loading operation.

As shown in FIG. 2, many small magnets 513 are provided at the bottom of the first substrate holder 51. These magnets 513 are hereinafter called "holder magnets". Each holder magnet 513 has magnetic poles on the top and the bottom. As shown in FIG. 2, the magnetic poles of the holder magnets 513 are alternatively opposite in an array direction.

Beneath the first substrate holder 51, a magnetic-coupling roller 711 is provided, interposing a partition wall 70. The magnetic-coupling roller 711 is a cylinder, on which two spirally elongated magnets 712 are provided as shown in FIG. 2. These magnets 712 are hereinafter called "roller magnets". A surface pole of each roller magnet 712 is opposite to each other. In short, the magnetic-coupling roller 711 has a so-called double-helix structure.

The magnetic-coupling roller 711 is provided at a position where the roller magnets 712 face to the holder magnet 513 through the partition wall 70. The partition wall 70 is formed of material with a high magnetic permeability. The holder magnets 513 and the roller magnets 712 are magnetically coupled with each other. One side of the partition wall 70 where the first substrate holder 51 is provided is a space kept at a vacuum pressure. The other side of the partition wall 70 where the magnetic-coupling roller 711 is provided is a space of the atmospheric pressure. The magnetic-coupling roller 711 is provided along the first transfer path 1 shown in FIG. 1.

A multiplicity of main pulleys 714 that are rotated around horizontal axes are provided along the first transfer path 1. As shown in FIG. 3, the first substrate holder 51 rides on the main pulleys 714. A couple of sub-pulleys 715,715 are contacted with a lower margin of the first substrate holder 51. The sub-pulleys 714,715 pinch the lower margin of the first substrate holder 51 to prevent fall of the first substrate holder 51. A multiplicity of the sub-pulleys 715, 715 are provided along the first transfer path 1 as well.

As shown in FIG. 3, a drive rod 716 is connected with the magnetic-coupling roller 711 through a bevel gear. A motor 717 is connected with the drive rod 716 so that the magnetic-coupling roller 711 can be rotated around its center axis by driving force transferred from the motor 717 through the drive rod 716.

When the magnetic-coupling roller 711 is rotated, the double-helix roller magnets 712 shown in FIG. 2 are also rotated. Situation that the roller magnets 712 are rotated is equivalent to situation that a plurality of aligned small magnets whose poles are alternately opposite simultaneously move linearly along an aligning direction. Therefore, the holder magnets 513 magnetically coupled with the roller magnets 712 also move linearly as the roller magnets 712 are rotated, resulting in that the first substrate holder 51 moves linearly as a whole. During this liner movement, the main pulleys 714 and the sub-pulleys 715,715 shown in FIG. 3 are driven to rotate following the movement.

Figure 4:
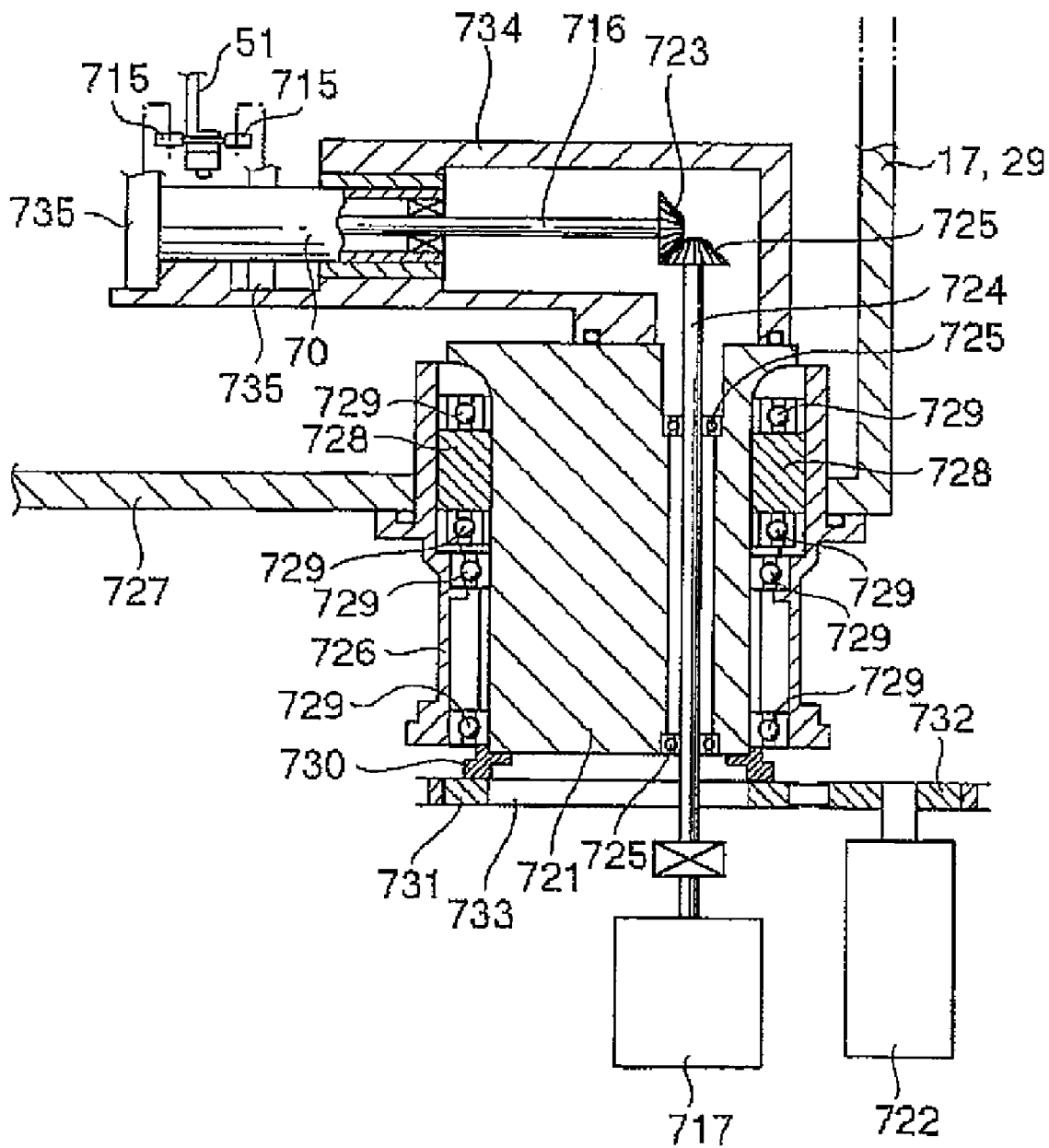
FIG. 4 shows a schematic side view of a direction-conversion mechanism provided in a direction-changing chamber 17 shown in FIG. 1.

In the composition shown in FIG. 1, the vacuum chambers provided at corners of the first and the second transfer path 1, 2 are the direction-conversion chambers 17, 29 comprising a direction-conversion mechanism that converts the transfer direction of the substrate 9 for 90 degrees. Using FIG. 4, a composition of the direction-conversion mechanism provided in the direction-conversion chamber 17 is described as an example. FIG. 4 shows a schematic side view of the direction-conversion mechanism provided in the direction-conversion chamber 17.

The direction-conversion mechanism shown in FIG. 4 is mainly composed of a holder 721 holding the linear movement mechanism including the magnetic-coupling rollers of the same composition as described (not shown in FIG. 4), and a motor 722 for rotating the holder 721, thereby rotating the linear movement mechanism as a whole.

A drive rod 716 is connected with a shaft of a magnetic-coupling roller (not shown in FIG. 4) through a motion transfer mechanism such as a bevel gear. Another bevel gear 723 is disposed at a rear end of the drive rod 716 as shown in FIG. 4. A power transmission rod 724 posing vertically is connected with this bevel gear 723. A bevel gear 725 engaging with the bevel gear 723 disposed at the rear end of drive rod 716 is provided at the top of the power transmission rod 716. An output shaft of a motor 717 is connected with a bottom end of the power transmission rod 724.

On the other hand, the holder 721 composing the direction-conversion mechanism is a member having a shape of a column or a cylinder, whose axis is vertical. As shown in FIG. 4, the holder 721 has a through hole lengthened vertically, through which the power transmission rod 724 is inserted. Bearings 725 are provided at a clearance between the inner surface of the through hole and the power transmission rod 724 so that the power transmission rod 724 is retained in the through hole while allowing the rotation of the power transmission rod 724.

The described holder 721 is placed in a holder cover 726. The holder cover 726 has a nearly cylindrical shape and a larger radius than the holder 721. The holder cover 726, which supports the holder 721, is installed with a bottom wall 727 of the direction-conversion chambers 17,29. The bottom wall 727 of the direction-conversion chambers 17,29 has a circular opening with a size that suits an outer diameter of the holder cover 726. The holder cover 726 is fitted in this opening. A vacuum seal such as an O-ring is provided at an interface of the holder cover 726 and the bottom wall 727.

Four bearings 729 and a mechanical seal 728 are provided at a clearance between the holder cover 726 and the holder 721. The mechanical seal 728 is interposed between the uppermost and next bearings 729. The mechanical seal 728 is to seal the clearance between the holder 721 and the holder cover 726 while allowing a rotation of the holder 721. As the mechanical seal 728, a seal mechanism using magnetic-fluid is preferably employed.

A pulley mount 730 is provided at the bottom of the holder 721. A holder pulley 731 is fixed at the bottom of the pulley mount 730. The holder pulley 731 is coaxial with the holder 721. A pulley 732 is provided at a position at the same level as the holder pulleys 731. An output shaft of a motor 722 is connected with the pulley 732. There is a belt 733 stretching between the pulley 732 and the side pulleys 731 to connect them. The pulley 731 and the pulley 732 are timing pulleys and the belt 733 is a timing belt.

A frame 734 as shown in FIG. 4 is fixed on an upper surface of the holder 721. The frame 734 is to retain together the first substrate holder 51, the magnetic-coupling roller 711 and other members shown in FIG. 2. As shown in FIG. 4, several supports 735 are provided uprightly on a lower part of the frame 734. The described main pulleys and the sub-pulleys are supported by the supports 735. A vacuum seal (not shown) is provided between the frame 734 and the holder 721 to prevent leak of vacuum in the direction-conversion chamber 17 from the inside of the frame 734.

An operation of such a direction-conversion mechanism in the direction-conversion chamber 17 is described as follows.

To begin with, when the motor 717 is operated, the rotation motion is transmitted to the magnetic-coupling roller (not shown in FIG. 4) through the power transmission rod 724 and the drive rod 716, thereby rotating the magnetic-coupling roller. As a result of this rotation, the first substrate holder 51 moves linearly.

When the first substrate holder 51 reaches a specific position in the direction-conversion chamber 17, the motor 722 is operated. A drive of the motors 722 is transmitted to the pulley 731 via the pulley 732 by the belt 733. As a result, the holder 721 is rotated, thereby rotating the linear transfer mechanism held by the holder 721 simultaneously. With this rotation, the first substrate holder 51 is also rotated. When the rotation angle reaches 90 degrees, the operation of the motor 722 is stopped, thereby stopping the rotation of the first substrate holder 51. By this operation, the transfer direction of the first substrate holder 51 is converted to a direction rotated by 90 degrees.

Afterwards, receiving a control signal, the linear transfer mechanism is driven so that the first substrate holder 51 can be moved along the first transfer path 1 in the direction rotated by 90 degrees to a next vacuum chamber. Therefore, the surface of the substrate 9 faces to the side of the transfer path 1, even after the substrate 9 turns a corner of the rectangular first transfer path 1.

In the described composition of the direction-conversion mechanism, the control of the rotation angle such as 90 degrees may be carried out by control of the motor 722 or by a detector (not shown) detecting the rotation angle of the holder 721.

Next are described details on the vacuum chambers of the first and the second groups.

First of all, the vacuum chambers of the first group are described. The first group is composed of a load lock chamber 11 in which the substrate 9 temporarily stays when it is transferred from the atmosphere, a pre-heat chamber 12 to which the substrate 9 is transferred next from the load lock chamber 11, an underlying-film deposition chamber 13 to which the substrate 9 is transferred next from the pre-heat chamber 12, a magnetic-film deposition chamber 14 to which the substrate 9 is transferred next to the underlying-film deposition chamber 13, the overcoat deposition chamber 15 to which the substrate 9 is transferred next from the magnetic-film deposition chamber 14, the first transition chamber 16 in which the substrate 9 temporarily stays when it is transferred to the second transfer path 2, the direction-conversion chambers 17, and an extra vacuum chamber 10.

The loading robot 61 is provided at the outside of the load lock chamber 11. The loading robots 61 is a robot that takes out the substrate 9 from a cassette 611 placed at a load station in the atmosphere, and load it onto the first substrate holder 51.

The pre-heat chamber 12 is a chamber in which the substrate 9 is heated to release gases existing on or in the substrate 9. The pre-heat chamber 12 comprises a lamp heater in it so that the substrate 9 is heated to a specific temperature.

Figure 5:
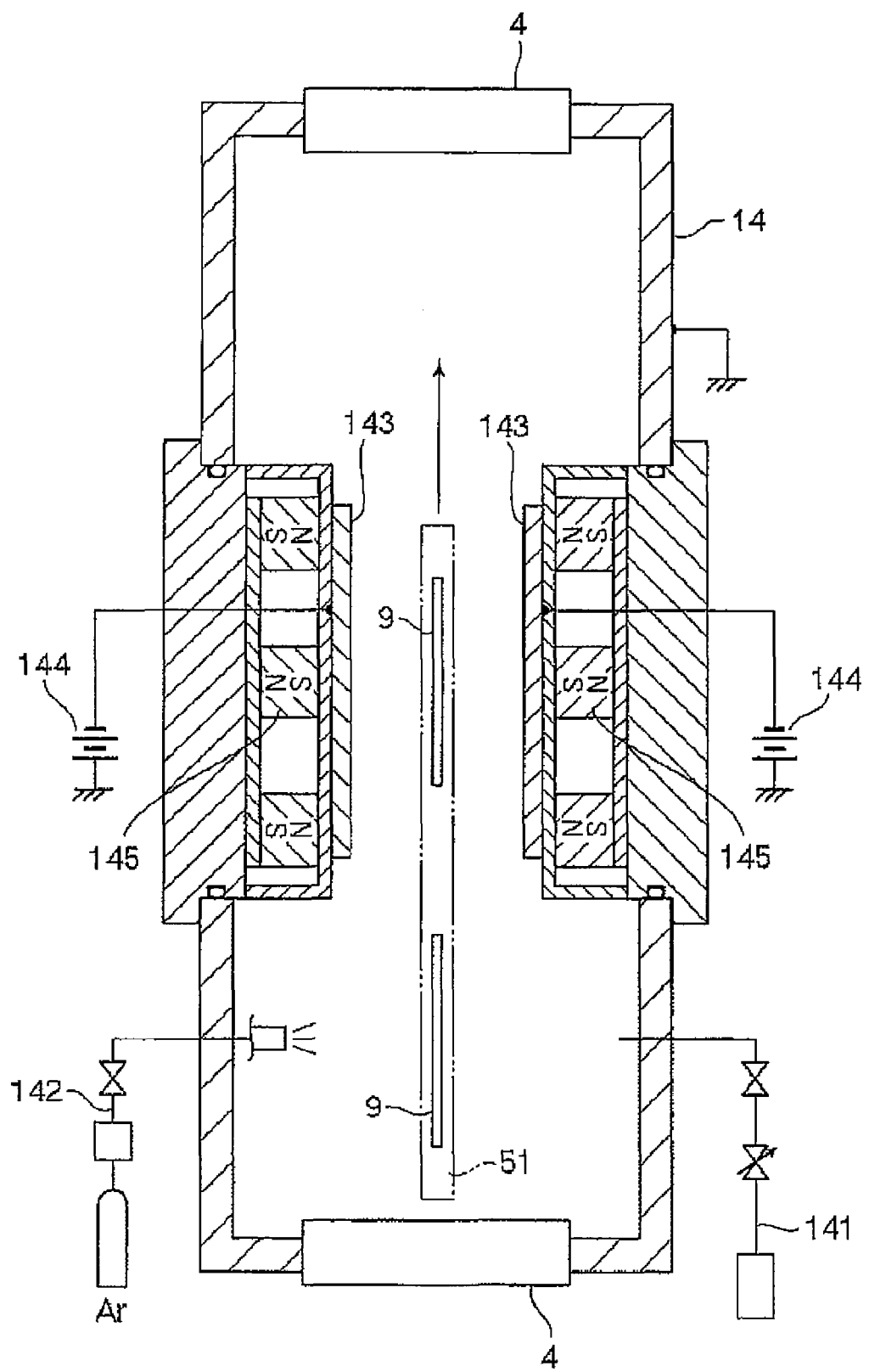
FIG. 5 shows a schematic plane view of a magnetic-film deposition chamber 14 shown in FIG. 1.

In the underlying-film deposition chamber 13 and the magnetic-film deposition chamber 14, a specific thin-film is deposited by sputtering. As an example, components on the magnetic-film deposition chamber 14 are described using FIG. 5. FIG. 5 shows a schematic plane view of the magnetic-film deposition chamber 14 shown in FIG. 1.

The magnetic-film deposition chamber 14 comprises a pumping system 141 that discharge an air in the chamber, a gas-introduction system 142 that introduces a process gas into the inside of the chamber, a target 143 whose surface to be sputtered is exposed to the inside space of the magnetic-film deposition chamber 14, a sputtering power supply 144 for applying voltage to the target 143 to generate a sputtering discharge, and a magnet assembly 145 provided behind the target 143 for the magnetron sputtering.

While introducing the process gas such as argon into the magnetic-film deposition chamber 14 by the gas introduction system 142 and maintaining a specific vacuum pressure by the pumping system 141, the sputtering power supply 144 is operated. As a result, the sputtering discharge is ignited. Particles released from the target through the sputtering discharge reach the substrate 9, thereby depositing a specific thin film on the substrate 9.

Figure 6:
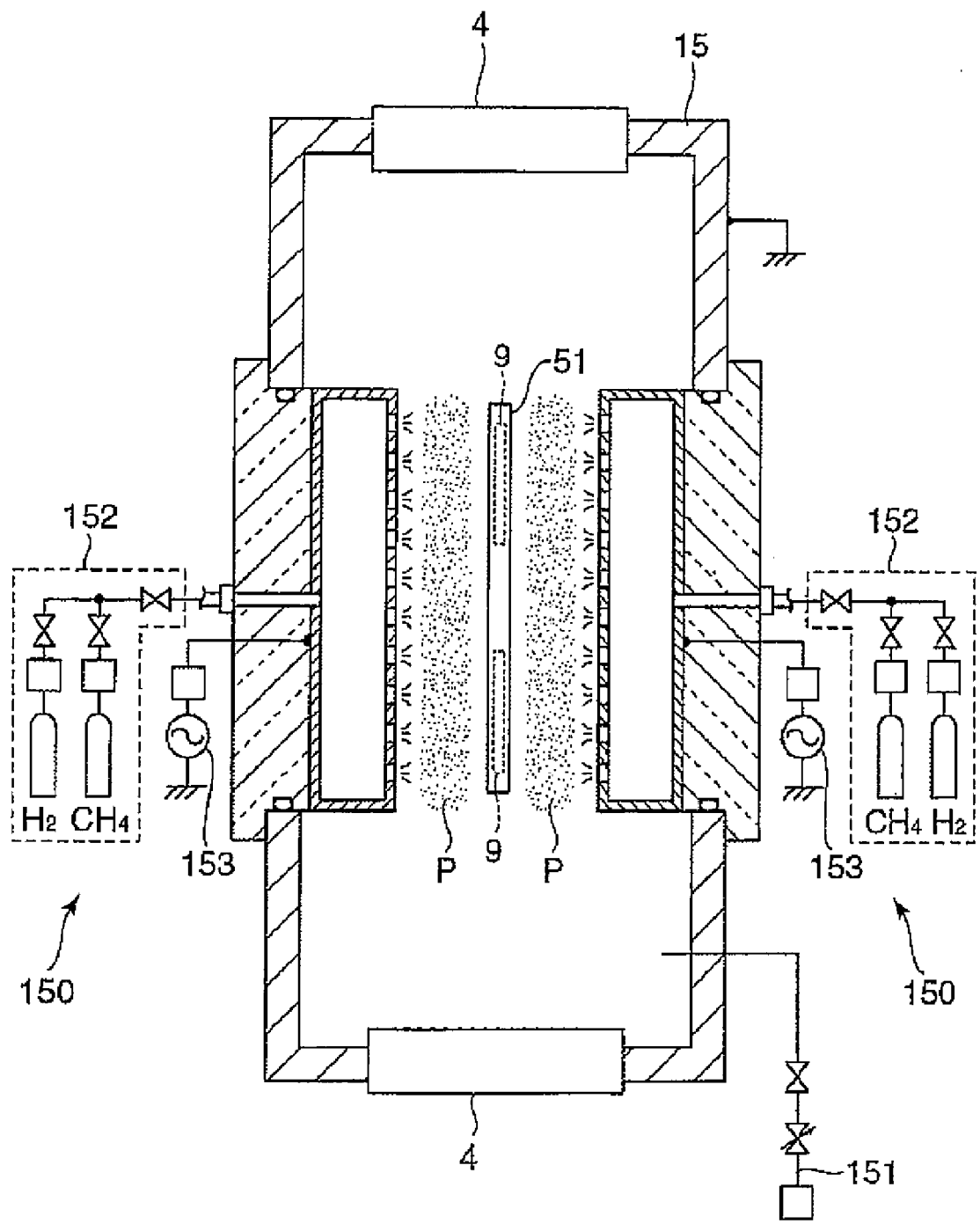
FIG. 6 shows a schematic plane view of an overcoat deposition chamber 15 shown in FIG. 1.

The overcoat deposition chamber 15 comprises a plasma generation means 150 so that plasma-enhanced chemical vapor deposition (PE-CVD) is enabled. FIG. 6 is a schematic plane view of the overcoat deposition chamber 15 shown in FIG. 1. The overcoat deposition chamber 15 comprises a pumping system 151 for discharging an air in the chamber. The plasma generation means 150 is mainly composed of a gas-introduction system 152 that introduces a gas mixture of hydrocarbon such as $CH_4$ and hydrogen into the chamber, and a HF power supply 153 for applying HF power to the gas mixture to form plasma P. Here, frequencies between LF (Low Frequency) and UHF (Ultra-High Frequency) are defined as HF (High Efficiency). The hydrocarbon gas decomposes in the plasma P, thereby depositing a carbon thin-film on the substrate 9. A self-bias voltage may be given to the substrate 9 by applying a HF voltage to the substrate 9 via the first substrate holder 51. The self-bias voltage is a voltage that has a negative direct current portion and is produced by a mutual reaction of the plasma P and the HF field.

In this embodiment, a couple of the underlying-film deposition chambers 13 and a couple of the magnetic-film deposition chambers 14 are provided, as shown in FIG. 1. The substrates 9 are transferred from one underlying-film deposition chamber 13, to the other underlying-film deposition chamber 13, to one magnetic-film deposition chamber 14, to the other magnetic-film deposition chamber 14 in order. In other words, the underlying film is deposited in a form of a double layer. And, the magnetic film is deposited on the double-layered underlying film in a form of a double layer as well. There may be another structure where a layer made of the underlying film and the magnetic film is doubled. Showing examples of the films, a Cr film is deposited as the underlying film, and a CoCrTa film is deposited as the magnetic film. As shown in FIG. 1, a couple of the overcoat deposition chambers 15 are provided. In the first overcoat deposition chamber 15, the overcoat is deposited at half of required thickness, and in the second overcoat deposition chamber 15 the overcoat with the rest half thickness is deposited.

Next are described details on the vacuum chambers of the second group.

The chambers of the second group is composed of the second transition chamber 21 in which the substrate 9 temporarily stays after the substrate 9 is transferred through the first transfer path 1 and the third transfer path 3, the first cleaning chamber 22 in which contaminants are removed from the substrates 9 by a plasma ashing method, the second cleaning chamber 23 in which contaminants are removed from the substrates 9 by a gas blowing method, a burnishing chamber 24 in which protrusions on the substrates 9 are removed, a lubricant-layer preparation chamber 25 in which the lubricant layer is prepared on the substrates 9, the post-preparation treatment chamber 26 in which the treatment is carried out after the lubricant-layer preparation, the cooling chamber 27, an extra chamber 20, an unload lock chamber 28 in which the substrate 9 temporarily stays when the substrate 9 is transferred to the atmosphere, and the direction-conversion chambers 29.

Figure 7:
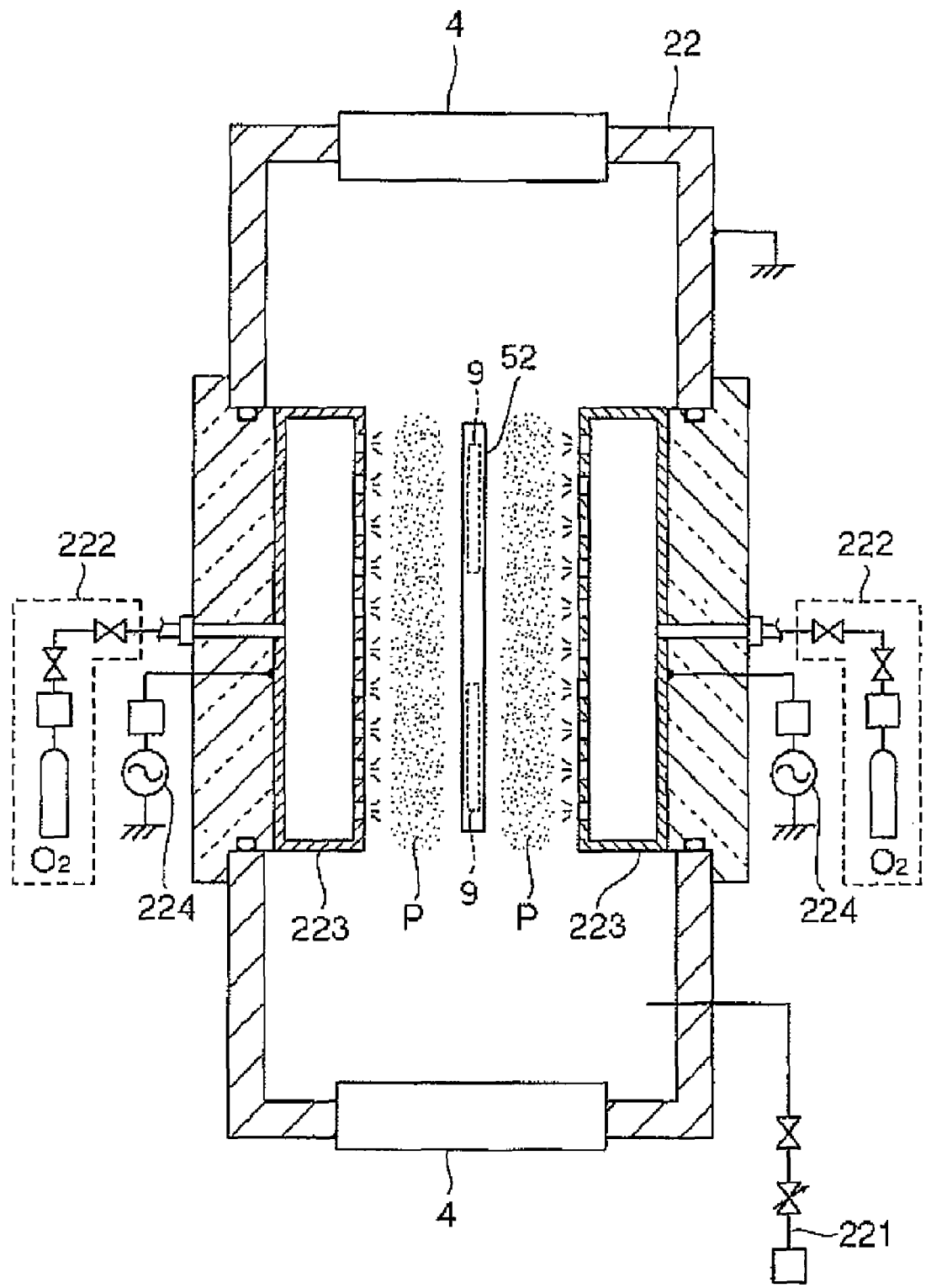
FIG. 7 shows a schematic plane view the first cleaning chamber 22 shown in FIG. 1.

One of points that characterize this embodiment is the first cleaning chamber 22. Components on the first cleaning chamber 22 are described using FIG. 7. FIG. 7 shows a schematic plane view of the first cleaning chamber 22 shown in FIG. 1.

In the first cleaning chamber 22, the contaminants are ashed by oxygen plasma. The components on the first cleaning chamber 22 are almost the same as on the overcoat deposition chamber 15 shown in FIG. 6, except that a gas-introduction system 222 introduces an oxygen gas. Concretely, the first cleaning chamber 22 comprises a couple of HF electrodes 223 located at both sides of the substrates 9 and a HF power source 224 that applies the HF voltage to the electrodes 223 to generate the plasma P.

The HF electrodes 223 are hollow and have a number of gas effusion holes on a surface facing to the substrates 9. The gas-introduction system 222 introduces oxygen gas into the first cleaning chamber 22 through the inside of the HF electrode 223. The gas-introduction system 222 may mix a buffer gas or a gas for improving discharge characteristics with the oxygen gas.

Contaminants formed of carbon or hydrocarbon sometimes adhere to the surface of the overcoat deposited on the substrates 9. Adhesion of the contaminants is caused from factors as described next. The adhesion of carbon mainly results from suspended particles in the overcoat deposition chamber 15. In the overcoat deposition chamber 15, thin films, i.e. carbon films, are deposited not only on the surfaces of the substrates 9 but also on exposed surfaces of members in the overcoat deposition chamber 15 and a surface of the first substrate holder 51. These thin-films may be peeled off by internal stress or another factors, when those grow to be thick films. The peeled thin film produces the suspended particles in the overcoat deposition chamber 15. If the particles adhere to the substrates 9, the wettability, i.e. a degree of contact, of the lubricant may deteriorate in the lubricant-layer preparation. Otherwise, abnormal film growth may take place to form minute protrusions on the substrates 9 in the overcoat deposition.

The adhesion of hydrocarbon is mainly caused under influence of residual gases in the overcoat deposition chamber 15. Though the overcoat is deposited utilizing decomposition of the hydrocarbon gas in the plasma, non-decomposed hydrocarbon gases still reside in the overcoat deposition chamber 15. These residual gases may adhere to the substrates 9. When adhesion of the residual gases is accumulated, the residual gases may grow to be molecules or particles of some size on the substrate 9. If such molecules or particles are produced on the surface of the substrate 9, wettability of the lubricant may deteriorate, or characteristics of the lubricant layer may be affected.

When the substrate 9 on which such contaminants exist is exposed to the oxygen plasma, the carbon and hydrocarbon are rapidly oxidized, i.e. burnt, thereby becoming volatile substances such as carbon dioxide and water. This oxidation is caused by species produced in the oxygen plasma such as oxygen ions, monoatomic oxygen molecules (O) that are active, and activated oxygen molecules (O2*). Those volatile substances are pumped out by the pumping system 221 of the first cleaning chamber 22. By carrying out such the ashing, it is enabled to suppress the problems that adhesion strength of the lubricant may decrease, and that a magnetic head may be obstructed by the minute protrusions on the surface of the magnetic recording disk.

On condition of the ashing, prudent examination is required. This is because excessive ashing may lead to eroding the surface of the overcoat. TABLE 1 shows a preferred example of conditions of the ashing on a substrate of 3.5-inch size.

TABLE 1

Preferred Ashing Condition

| Condition | Preferred range or value |
| --- | --- |
| Pressure in the chamber 22 | 1-2 (Pa) |
| Flow rate of oxygen gas | 100 (SCCM) |
| HF power | 50 (W) |
| Frequency | 13.56 (MHz) |

In TABLE 1, "SCCM" means a gas flow rate converted at 0° C. and 1 atm, standing for "Standard Cubic Centimeter per Minute". When the ashing is carried out on the above condition, the contaminants can be removed within 0.3-2.0 seconds, while preventing the problem of the overcoat erosion. If the ashing is carried out with HF power over 50 W, or if the ashing is carried out over 2.0 seconds, the overcoat might be eroded. Therefore, it is preferable that the ashing is carried out with HF power of 50 W or less and for 2.0 seconds or less.

Figure 8:
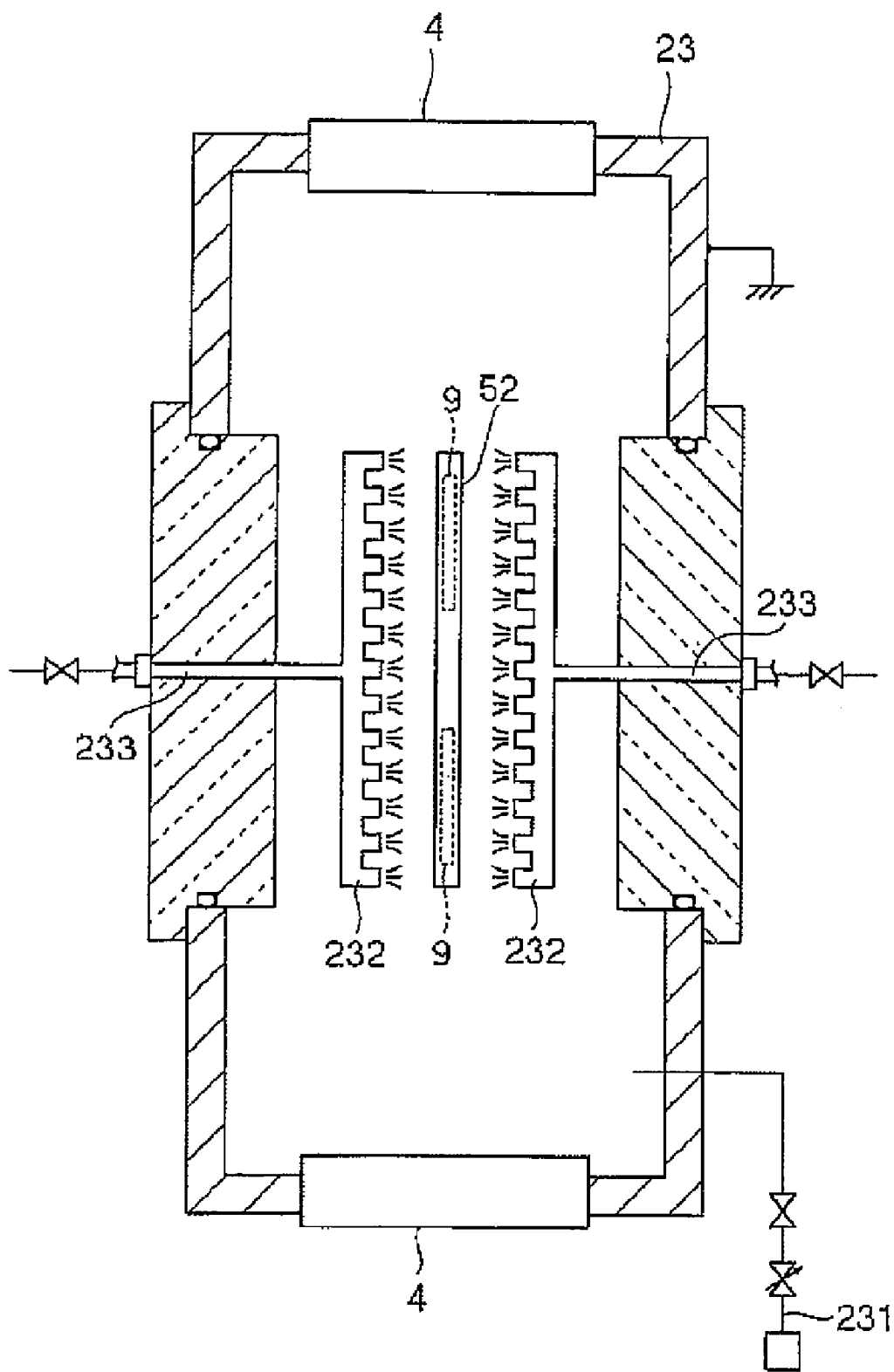
FIG. 8 shows a schematic plane view of the second cleaning chamber 22 shown in FIG. 1.

Next are described components on the second cleaning chamber 23. FIG. 8 shows a schematic plane view of the second cleaning chamber 23 shown in FIG. 1.

The second cleaning chamber 23 comprises a pumping system 231 that discharges an air in the chamber, and a couple of gas introduction tubes 233 having a nozzle 232 that eject a gas toward the substrates 9. Each nozzle 232 is a circular disk and parallel to the substrates 9. Each nozzle 232 has a diameter little larger than that of the substrate 9. Many gas ejection holes are provided on each nozzle 232 with an equal interval.

The gas is ejected from each nozzle 232 onto of the substrates 9 so that the contaminants adhering on the substrates 9 can be blown away. A pressure in the second cleaning chamber 23 is about $1 \times 10^{-4}$-$1 \times 10^{-5}$ Pa, and an ejection pressure of the gas at the substrates 9 is about 100 Pa. For this gas, an inert gas such as argon or nitrogen is adopted. A filter that removes the contaminants is preferably provided on a gas introduction line (not shown) connected with the gas introduction tube 233.

It may be possible to carry out the described gas-blow cleaning at the atmosphere. However, the gas-blow cleaning in the atmosphere has higher probability that the contaminants still remain after the cleaning than the cleaning in vacuum, because cleanliness of ambience is worse.

It can be adopted to clean the substrate 9 by extra-fine fibers instead of the cleaning by the plasma or the gas blow. Specifically, the substrate 9 is rubbed with a fabric made of extra-fine fibers of about 0.06 denier. This fabric is similar to one that is on sale as a glass wiper.

Next is described about the burnishing chamber 24.

Figure 9:
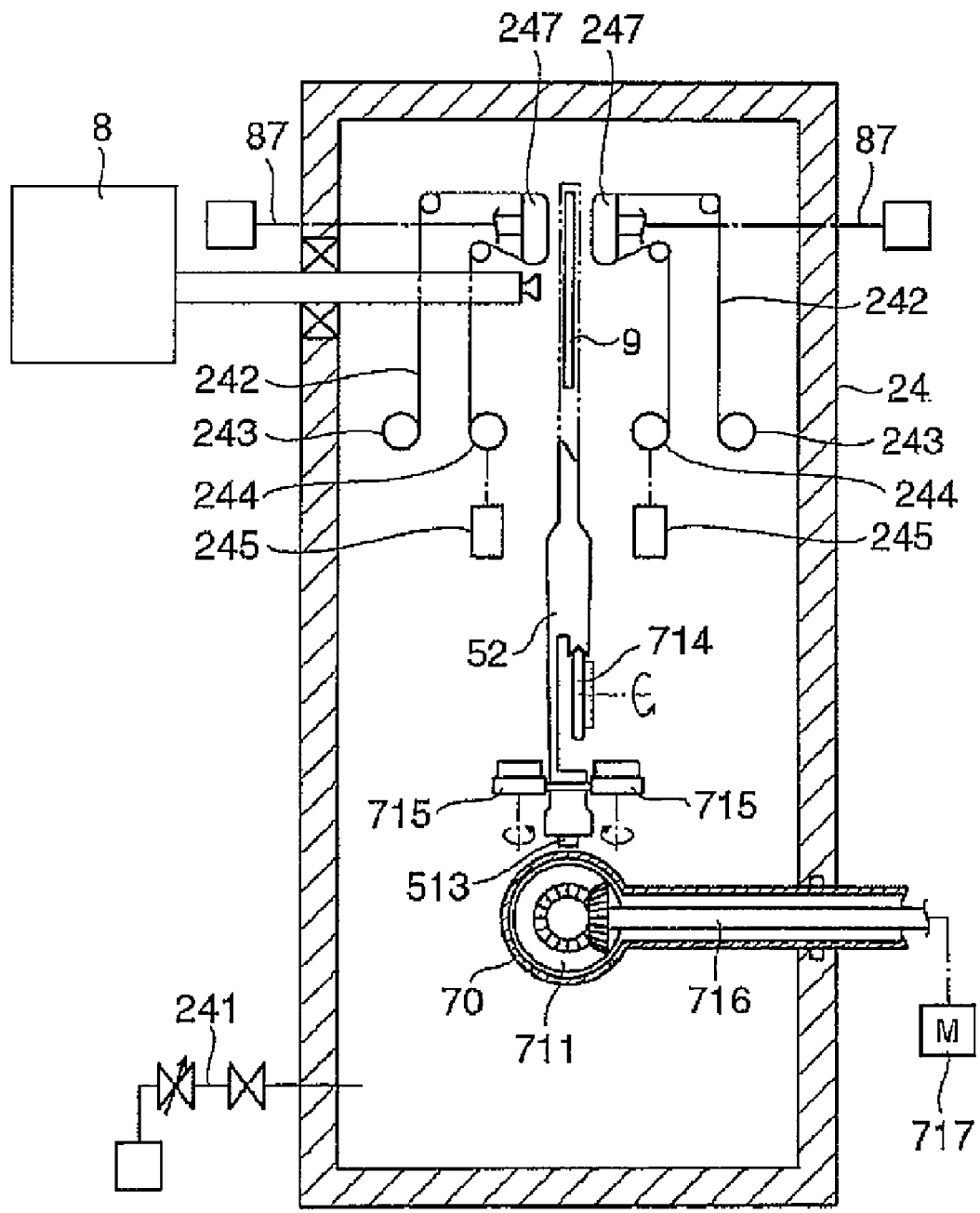
FIG. 9 shows a schematic side view of a burnishing chamber 24 shown in FIG. 1.

FIG. 9 shows a schematic side view of the burnishing chamber 24 shown in FIG. 1. As shown in FIG. 9, the burnishing chamber 24 comprises a pumping system 241 that discharges an air in the chamber, a rotation mechanisms 8 that holds and rotates the substrate 9 around a rotation axis corresponding to the center of the substrate 9, and a burnishing tape 242 that is pressed on the substrate 9 being rotated by the rotation mechanism 8.

Figure 10:
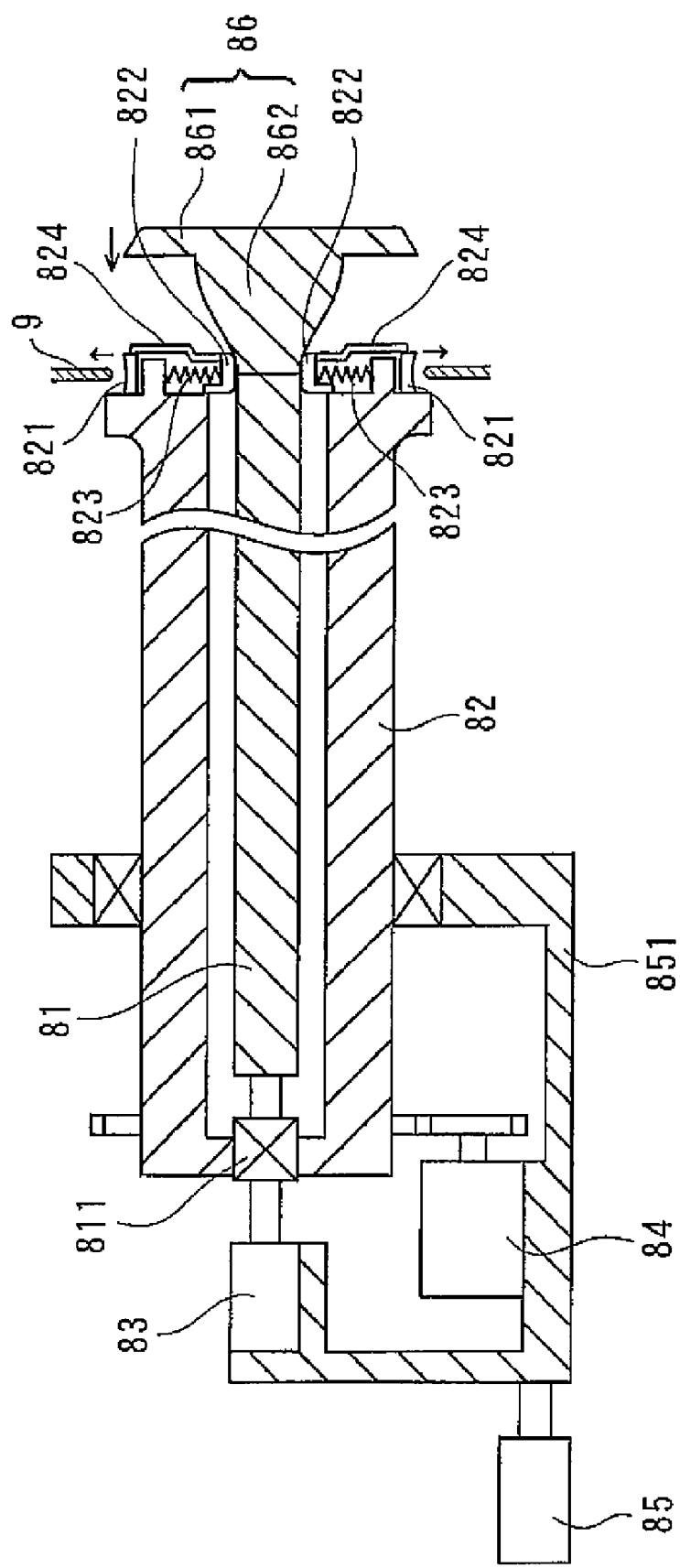
FIG. 10 shows a schematic cross-sectional view of a rotation mechanism 8 shown in FIG. 9.

A detail of the rotation mechanisms 8 is described using FIG. 10. FIG. 10 shows a schematic cross-sectional view of the rotation mechanism 8 shown in FIG. 9. As shown in FIG. 10, the rotation mechanism 8 is mainly composed of a back-and-fore drive shaft 81 elongated horizontally, a cylindrical rotation drive shaft 82 provided coaxially with the back-and-fore drive shaft 81, the first back-and-fore drive source 83 that drives the back-and-fore drive shaft 81, a rotation drive source 84 that rotates the rotation shaft 82, and the second back-and-fore drive source 85 which moves backward or forward the back-and-fore drive shaft 81 and the rotation drive shaft 82 together.

At an end of the back-and-fore drive shaft 81, a drive head 86 is provided. The drive head 86 is formed of a disk portion 861 that is slightly smaller than a center opening of the substrate 9, and a taper portion 862 with a shape of circular cone coaxial with the back-and-fore drive shaft 81.

Figure 11:
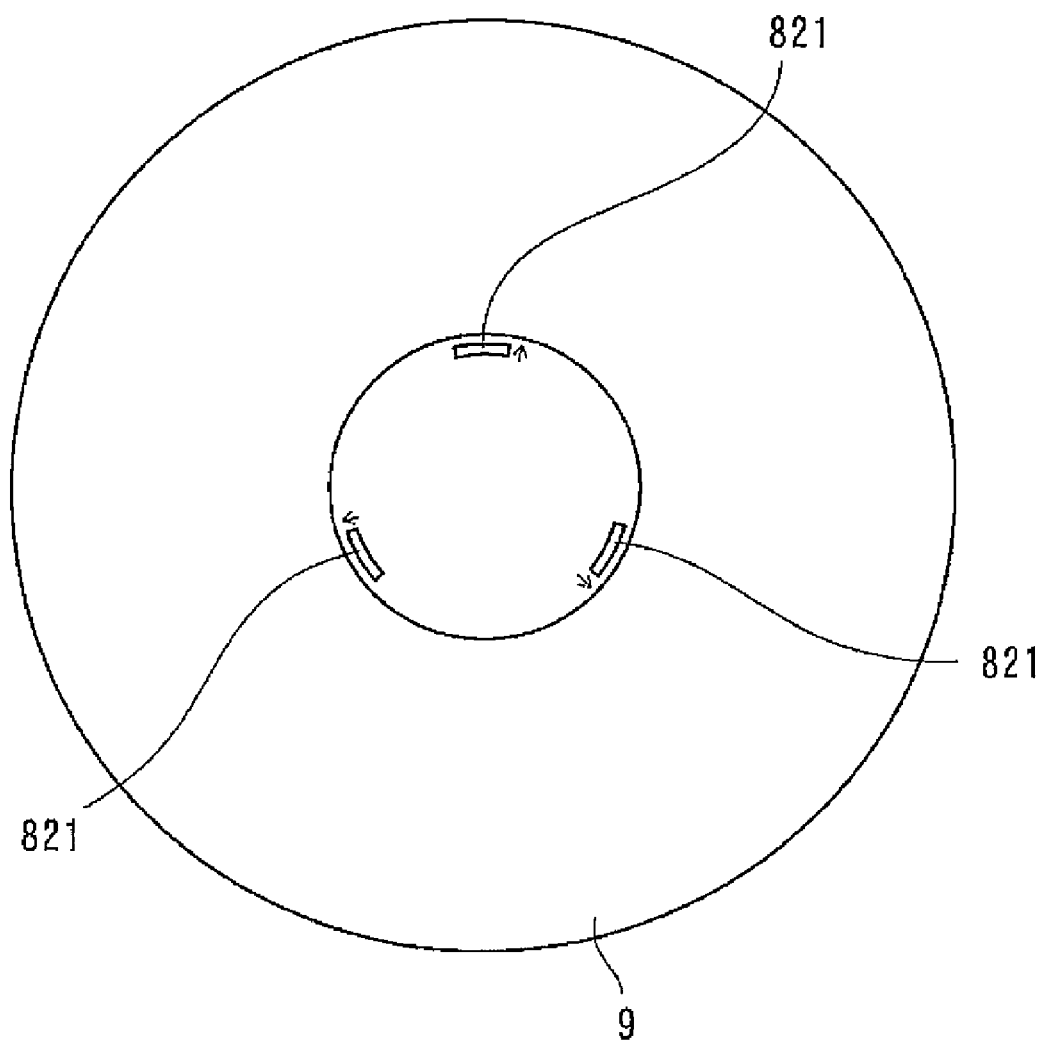
FIG. 11 shows a front view explaining locations of contact blades 821 shown in FIG. 10.

Contact blades 821 are provided at an end of the rotation drive shaft 82. The contact blades 821 are members that contact an inner edge of the center opening of the substrate 9, when the substrate 9 is held by the rotation mechanism 8. FIG. 11 shows a front view explaining locations of the contact blades 821 shown in FIG. 10. As shown in FIG. 11, three contact blades 821 are provided at every 120 degrees on a circumference coaxial with the back-and-fore drive shaft 81. As shown in FIG. 10, a cross-sectional shape of each contact blade 821 is like a curved concave or a "V"-shape.

As shown in FIG. 10, driven blades 822 contacting a tapered surface of the taper portion 862 are provided. Connection plates 824 are provided. The connection plates 824 connect each driven blade 822 and each contact blade 821 respectively. Projections are provided on an end of the rotation shaft 82. Spring members 823 such as coil springs connecting each protrusion and each driven blade 22 are provided. Each driven blade 822 is fixed with each projection through each spring member 823. The contact blades 821 are located outside the projections. The contact blades 821 can slide on the end of the rotation shaft 82.

The back-and-fore drive shaft 81 is connected with the first back-and-fore drive source 83 through a joint mechanism 811 capable of disconnection. The first back-and-fore drive source 83 is a linear motion source that is a combination of a servomotor and a precise screw, or a linear actuator such as an air cylinder. The rotation drive source 84 is a motor connected with the outer surface of the rotation drive shaft 82 through gears. The second drive source 85 moves the frame 851 backward or forward, on which the back-and-fore drive shaft 81, the rotation driving shaft 82, the first back-and-fore drive source 83 are mounted, thereby moving them simultaneously as a whole. The rotation drive shaft 82 penetrates airtightly a wall of the burnishing chamber 24 with a vacuum seal such as a mechanical seal.

A lever (not shown) linked to the described rotation mechanism 8 is provided in the burnishing chamber 23. This lever has the same function as the described lever 60 provided in each robot 61, 62, 63.

On the other hand, a storing roller 243 for storing the burnishing tape 242 is provided in the burnishing chamber 24. The burnishing tape 242 is rolled up around the storing roller 243 in advance. The burnishing tape 242 is used for the burnishing, being rolled out from the storing roller 243. A retrieval roller 244 that retrieves a used portion of the burnishing tape 242 is provided in the burnishing chamber 24. The retrieval roller 244 is rotated by a vacuum motor (a motor operable in a vacuum environment) 245 to retrieve the used portion of the burnishing tape 242. During this rotation for the retrieval, the storing roller 243 is forced to rotate, thereby drawing out a virgin portion of the burnishing tape 242.

Figure 12:
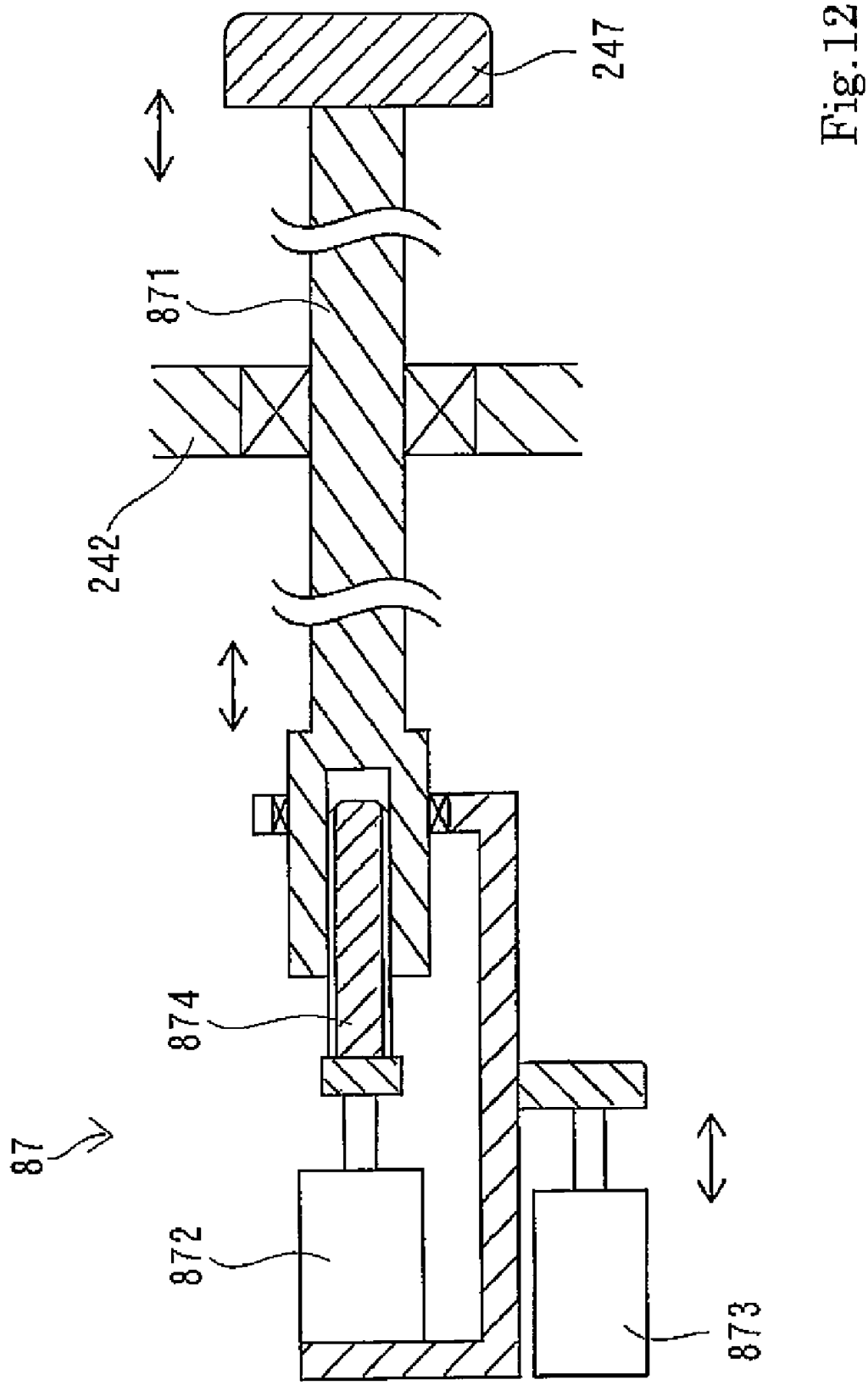
FIG. 12 shows s schematic side view of a drive mechanism 87 that drives a pusher 247 shown in FIG. 9.

A pressure member 247 that presses the burnishing tape 242 against the substrate 9 is provided. A drive mechanism 87 is also provided in the pressure member 247. FIG. 12 shows a schematic side view of the drive mechanism 87 that drives the pressure member 247 shown in FIG. 9.

As shown in FIG. 12, the drive mechanism is mainly composed of a drive shaft 871, a torque motor 872 that drives the drive shaft 871, a linear drive source 873 for moving backward or forward the drive shaft 871 and the torque motor 872 together. The pressure member 247 is fixed at an end of the drive shaft 871. The torque motor moves the drive shaft 871 forward so that the pressure member 247 is pressed against the substrate 9.

A precise screw, or a ball thread, 874 is jointed with an output shaft of the torque motor 872. A rear portion of the drive shaft 871 is hollow. An inner surface of this portion is screwed, with which the precise screw 874 is engaged. A rotation of the drive shaft 871 is restrained by a restraint member (not shown). As the linear drive source 873, a combination of a motor and a precise screw, or an air cylinder is adopted. The drive shaft 871 airtightly penetrates a wall of the burnishing chamber 24 with a vacuum seal such as a mechanical seal. As understood from FIG. 9, the burnishing tape 242, the storing roller 243, the retrieval roller 244, the vacuum motor 245, the pressure member 247 and the drive mechanism are provided at both sides of a location of the substrate 9, respectively.

A width of a pressing area on the pressure member 247 is nearly the same as a difference between a radius of the center opening and a radius of the substrate 9. The width of the pressing area may be shortened, if the substrate 9 moves along a radius direction relative to the burnishing tape 243 and the pressure member 247 while the substrate 9 is rotated.

An operation of the burnishing chamber 24 is described as follows.

The burnishing chamber 24 is pumped by the pumping system 241 in advance. The second back-and-fore drive source 85 moves the back-and-fore drive shaft 81 and the rotation shaft 82 to a standby position in advance. In a state that a pressure in the burnishing chamber 24 is maintained at a specific vacuum pressure, the second substrate holder 52 holding the substrates 9 is moved into the burnishing chamber 24. The second substrate holder 52 is stopped at a position where the center of one of the substrates 9 corresponds to the center axis of the back-and-fore drive shaft 81 shown in FIG. 9 and FIG. 10.

Next, the second back-and-fore drive source 85 is operated to move the back-and-fore drive shaft 81 and the rotation drive shaft 82 forward simultaneously. The back-and-fore drive shaft 81 and the rotation drive shaft 82 are stopped at a position where the drive head 86 is projected through the opening of the substrate 9 and the contact blades 821 are located at the same vertical plane as the substrate 9, as shown in FIG. 10.

In this state, the first back-and-fore drive source 83 is operated to move the back-and-fore drive shaft 81 backward. As the back-and-fore drive shaft 81 is moved backward, the driven blades 822 contacting the tapered surface of the taper portion 862 shift outward against elasticity of the spring member 823. Concurrently, each contact blade 821 also shifts outward, thereby contacting the inner edge of the center opening of the substrate 9. The first back-and-fore drive source 83 applies adequate force that works so as to move the back-and-fore drive shaft 81 backward. Therefore, each contact blade 821 is pressed onto the inner edge of the center opening of the substrate 9 adequately. With this operation, the substrate 9 is held by the rotation mechanism 8.

In this state, the lever (not shown in FIG. 9) is driven to expand each of the spring bands (not shown in FIG. 9) outwardly. As a result, the substrate 9 is held only by the rotation mechanism 8.

Next, the rotation drive source 84 of the rotation mechanism 8 is operated to rotate the back-and-fore drive shaft 81 and the rotation drive shaft 82 together. With the rotations of the back-and-fore drive shaft 81 and the rotation drive shaft 82, the substrate 9 held by the contact blades 821 is also rotated. During this rotation, the joint mechanism 811 disconnects the back-and-fore drive shaft 81 from the first back-and-fore drive source 83.

While the substrate 9 is rotated, the drive mechanism 87 at both sides of the substrates is operated. The pressure members 247 at both sides are moved to a specific fore position by the linear drive source 873. This fore position is slightly back from a position at which the pressure member 247 just presses the burnishing tape against the substrate 9. Next, the torque motor 872 is operated to move the pressure member 247 slightly forward. As a result, the pressure member 247 presses the burnishing tape 242 against the substrate 9. A generated torque is adjusted to control a press pressure of the burnishing tape 242 at a specific value.

The substrate 9 is rubbed with the pressed burnishing tape 242, resulting in that protrusions on the substrate 9 are removed. In addition to the protrusion removal, the contaminations are sometimes removed if those have adhered to the substrate 9. The burnishing tape 242 is, for example, a tape made of polyethylene-terephthalate or polyamide, on which many abrasive grains such as alumina grains or silicon carbide gains are fixed. A rotation speed of the substrate 9 may be 100-4000 rpm.

Prudent examination is required for determining a pressing force of the pressure member 247. When the burnishing by the burnishing tape 242 is carried out in vacuum, a friction force between the burnishing tape 242 and the substrate 9 is higher than that in the atmosphere. Therefore, if the burnishing tape is pressed with the same force as in the case of the burnishing in the atmosphere, the substrate 9 is scraped excessively. As a result, not only protrusion can be removed, but also thickness of the overcoat might be made thinner. For example, in the case of the burnishing at about $1.0 \times 10^{-2}$-$100$ Pa, a pressure force is preferably 9.8-588 mN.

There may be a case that the burnishing is carried out without moving the substrate 9 but with moving the burnishing tape 242, i.e. with retrieving the burnishing tape, while the burnishing tape 242 is pressed against the substrate 9. In this case, the pressure member 247 is modified into a member that corresponds with a following roller.

After carrying out the described burnishing on the whole surface of the substrate 9, the drive mechanism 8 moves the pressure member 247 to a specific back position, and the operation of the rotation drive source 84 is stopped. Next, the lever releases the spring bands to make the second substrate holder 52 hold the substrate 9 by the pallets again. After the first back-and-fore drive source 83 and the back-and-fore drive shaft 81 are jointed by the joint mechanism 811 again, the first back-and-fore drive source 83 moves the back-and-fore drive shaft 81 forward by a specific distance. As a result, the contact blades 821 are moved inside by elasticity of the spring member 823, and the rotation mechanism 8 releases the substrate 9. Then, the second back-and-fore drive source 85 moves the back-and-fore drive shaft 81 and the rotation drive shaft 82 backward together to the initial stand-by position.

Next, the second substrate holder 52 is moved to a position where the center of the other substrate 9 is just on an axis of the back-and-fore drive shaft 81. Then, the burnishing is carried out on the other substrate 9 as well by repeating the same operation as described. As shown in FIG. 1, a couple of the burnishing chambers 24 are provided interposing the lubricant-layer preparation chamber 25. Therefore, the burnishing is carried out before and after the lubricant-layer preparation.

Next is described about the lubricant-layer preparation chamber 25.

Figure 13:
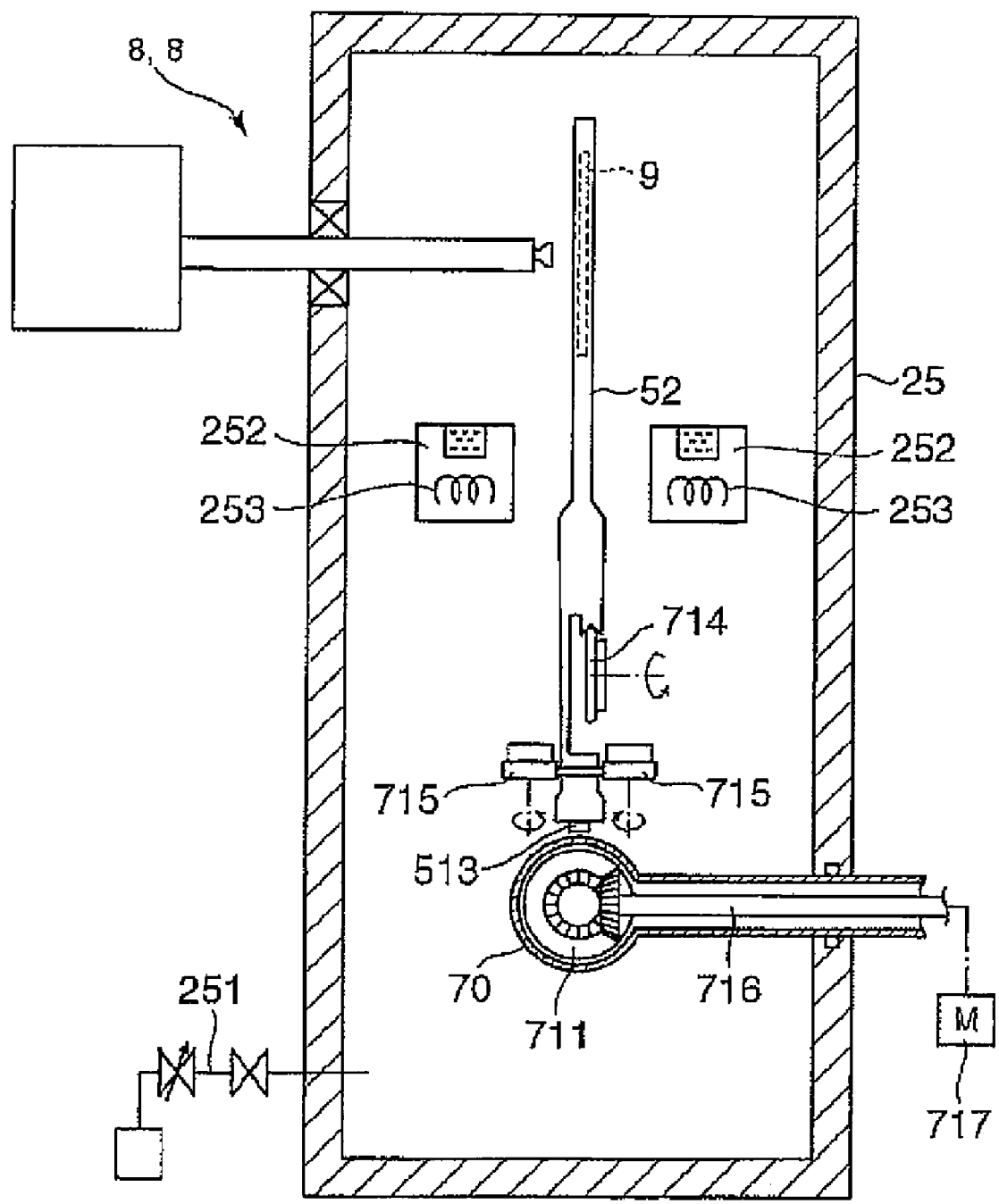
FIG. 13 shows a schematic side view of a lubricant-layer preparation chamber 25 shown in FIG. 1.

FIG. 13 shows a schematic side view of the lubricant-layer preparation chamber 25 shown in FIG. 1. The lubricant-layer preparation chamber 25 is a chamber in which the lubricant layer is prepared on the substrate 9 in vacuum. The lubricant layer is prepared by the vacuum vapor deposition method in the lubricant-layer preparation chamber 25.

As shown in FIG. 13, the lubricant-layer preparation chamber 25 comprises a pumping system that discharges an air in the chamber, a couple of pots 252 in which lubricant is stored, a heater 253 for evaporating the lubricant in each pot 252, and a rotation mechanism 8 for rotating the substrate 9 during the deposition.

The lubricant is stored in the pots 252 without diluting with any solvent. The heater 253 is a kind of resistance heaters. Other than the resistance heaters, an electron-beam irradiation heater or an HF induction heater may be employed as the heater 253. A shutter is provided over each pot 252 if necessary.

The rotation mechanism 8 may be the same as one provided in the burnishing chamber 24 shown in FIG. 9. In this embodiment, a couple of the rotation mechanisms 8 are provided so that two substrates 9 can be rotated simultaneously.

An operation of the lubricant-layer preparation chamber 25 shown in FIG. 13 is described as follows.

The lubricant-layer preparation chamber 25 is pumped by the pumping system 251 in advance. In a state that a pressure in the burnishing chamber 25 is maintained at a specific vacuum pressure, the second substrate holder 52 holding the substrates 9 is moved into the lubricant-layer preparation chamber 25 and is stopped. Each rotation mechanism 8 holds and rotates each substrate 9, respectively. Simultaneously, each heater 253 heats the lubricant in each pot 252. The lubricant is evaporated by heating, thereby depositing a lubricant film as the lubricant layer on each substrate 9. The lubricant layer is prepared on two substrates 9 simultaneously. A principal component of the lubricant may be PEPE. A molecular weight of the lubricant may be 2000-4000. As commercially available lubricant of this kind, there are ZDOL200 and ZDOL4000 (production names) of AUSMONT Corporation.

A heating temperature by the heater may be 50-310° C. A pressure in the lubricant-layer preparation chamber 25 may be about $1.0\times10^{-2}$-10 Pa. When the deposition is carried out under such conditions, the lubricant film of 1-2 nm in thickness is deposited within 3-5 seconds. A rotation speed is lower than that in the described burnishing. Specifically, it may be about 5-500 rpm.

After carrying out the lubricant-layer preparation, the operations of the heater 253 and the rotation mechanisms 8 are stopped. The substrates 9 are returned to the second substrate holder 52. After the lubricant-layer preparation chamber 25 is pumped again, the second substrate holder 52 is moved to the next post-preparation treatment chamber 26.

Figure 14:
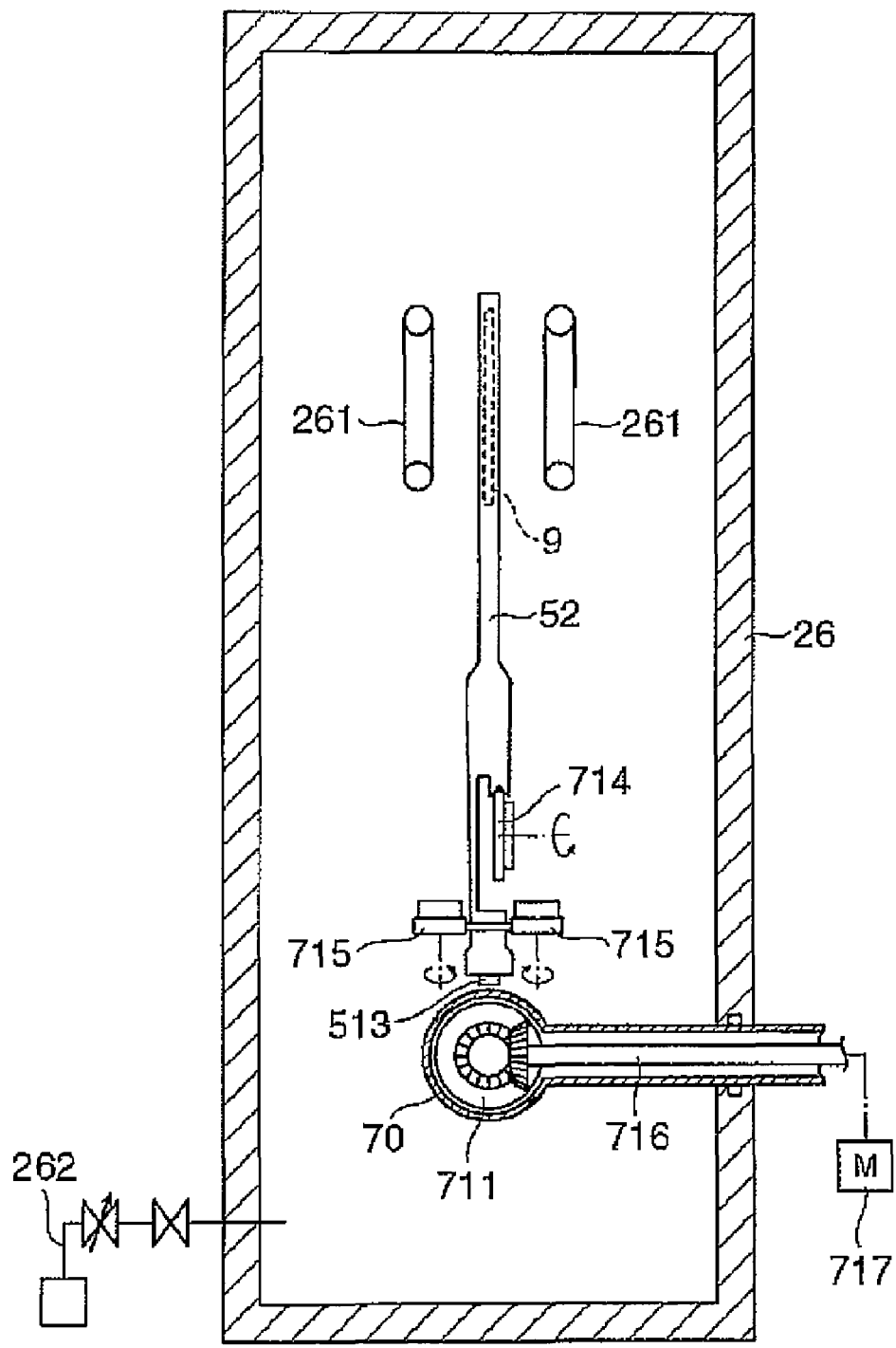
FIG. 14 shows a schematic side view of a post-preparation treatment chamber 26 shown in FIG. 1.

Next are described about the post-preparation treatment chamber 26 and the cooling chamber 27. FIG. 14 shows a schematic side view of the post-preparation treatment chamber as shown in FIG. 1.

The optimum bonded ratio is supposed 20-30% as described. In this embodiment, a bonded ratio within this range is accomplished by heating the substrates 9 in the post-preparation treatment chamber 26, and by optimizing a heating temperature and a heating time. Specifically, the above bonded ratio is accomplished by maintaining a temperature of the substrate 9 at 30-150° C. for 3-5 seconds.

As shown in FIG. 14, an infrared (IR) lamp 261 is provided at both sides of the substrate 9 held with the second substrate holder 52 in the post-preparation treatment chamber 26. A pumping system 262 is provided in the post-preparation treatment chamber 26. The pumping system 262 pumps the post-preparation treatment chamber 26 to maintain a pressure at $1\times10^{-4}$-$1\times10^{-5}$ Pa during the post-preparation treatment. Although the vacuum is not an indispensable condition for the post-preparation treatment because this is the step after the lubricant preparation, it is enabled to prevent the contaminants from being adsorbed on a hot surface of the heated lubricant layer by carrying out the post-preparation treatment in vacuum.

Instead of the heating, the post-preparation treatment may be carried out by irradiation. For example, in a case that the lubricant is capable of photo polymerization, a degree of the polymerization of the lubricant can be controlled by irradiating light such as ultraviolet ray. By this control, it is possible to adjust an adhesive strength and surface lubricity of the lubricant layer. If this method is employed, an ultraviolet (UV) lamp may be used instead of the IR lamp 261.

The cooling chamber 27 is one for cooling the substrate 9 after the treatment so that the unloading robot 62 can easily handle the substrate 9 in the unload lock chamber 28. In the cooling chamber 27, a cooling gas such as hydrogen or helium is blown on the substrate 9, thereby cooling it down at about 100° C. or below. The cooling system disclosed in Japanese Patent Publication No. 11-203734 is preferably applied to this cooling chamber 27. The unloading robot 62 provided in the unload lock chamber 28 takes out the substrate 9 from the second substrate holder 52, and transfer it to an unloading cassette 621 placed in the atmosphere.

Next is described a whole operation of the apparatus of this embodiment as follows. The following is a description of a manufacturing method according to an embodiment of the invention too.

Two of the substrates 9 are transferred from the loading cassette 611 in the atmosphere to the load lock chamber 11 by the loading robot 61 piece by piece, and are loaded on the first substrate holder 51. The first substrate holder 51 is moved to the pre-heat chamber 12. The substrates 9 are pre-heated in the pre-heat chamber 12. After the pre-heating, the first substrate holder 51 is moved to the underlying-film deposition chamber 13, the magnetic-film deposition chamber 14, and the overcoat deposition chamber 15 in order, thereby accumulatively depositing the underling film, the magnetic film and the overcoat on the substrates 9.

The substrates 9 are unloaded from the first substrate holder 51 by the shifting robot 63 in the first transition chamber 16, and are loaded on the second substrate holder 52 on standby in the second transition chamber 21. The first substrate holder 51 without the substrates 9 is returned to the load lock chamber 11, in which next two substrates 9 are loaded.

On the other hand, the second substrate holder 52 holding the substrates 9 is moved to the first cleaning chamber 22, the second cleaning chamber 23, the burnishing chamber 24 and the lubricant-layer preparation chamber 25 in order, thereby preparing the lubricant layer on the overcoat. Consequently, the second substrate holder 52 is moved to the post-preparation treatment chamber 26 and the cooling chamber in order, thereby carrying out the treatment and the cooling of the substrates 9. When the second substrate holder 52 reaches the unload lock chamber 28, the substrates 9 are unloaded from the second substrate holder 52 and transferred out to the unloading cassette 621 at the atmosphere. The second substrate holder 52 without the substrates 9 is moved to the second transition chamber 21 for holding next two substrates 9. The second substrate holder 52 holding the next two substrates 9 is circulated along the second transfer path 2. During this operation, in each chamber 10-17, 20-29, the first substrate holder 51 or the second substrate holder 52 is located. Each substrate holder 51,52 is moved to the next chamber 10-17, 20-29 at every tact time.

The described apparatus of this embodiment has advantages as follows.

First of all, because it is possible to carry out the steps from the underlying-film deposition to the lubricant-layer preparation with the only one apparatus, costs such as an equipment cost for manufacture and a labor cost for operation are reduced. An unmanned operation is possible while all the substrates 9 in the loading cassette 611 are processed and unloaded to the unloading cassette 621. Therefore, the productivity is improved because an unmanned operation time is extended.

In addition, because the steps after the overcoat deposition to the lubricant-layer preparation are carried out without breaking vacuum, the incorporation or the adhesion of the contaminants with the overcoat and the lubricant layer is prevented. Accordingly, the apparatus of this embodiment can suppress the problems that: the recording layer may be contaminated; the adhesive strength of the lubricant layer may decrease; the thickness of the lubricant-layer may be made out of uniform; and control accuracy of the bonded-ratio of lubricant-layer may decrease. Therefore, the apparatus of this embodiment is much suitable for manufacture of the magnetic recording disks, where the spacing is decreasing.

In addition, because the contaminants on the substrate 9 are removed by the plasma-enhanced ashing method and the gas blow method, the above advantages are made higher. The plasma-enhanced ashing method is effective mainly for removal of the organic contaminants. The gas-blowing method is effective mainly for removal of the inorganic contaminants such as metal or glass. After the cleanings in the first cleaning chamber 22 and the second cleaning chamber 23, the substrate 9 is transferred to the lubricant-layer preparation chamber 25 without being exposed to the atmosphere. The lubricant layer is prepared on the surface of the substrate 9 that remains cleaned, because the surface is not contaminated by the atmosphere. Therefore, the above advantages are also made higher from this point.

In addition, because the burnishing is carried out in vacuum, the contaminants in the atmosphere never adhere to the substrate 9 during the burnishing. From this point, the problems caused by the contaminants are prevented as well. Because the substrate 9 is transferred to the post-preparation treatment chamber 26 without being exposed to the atmosphere after the lubricant-layer deposition, this advantage is also made higher.

The point that the lubricant is used without diluting with solvent brings following advantages.

As solvent for the lubricant, flon (chloro-fluoro-carbon) conventionally has been used because the lubricant is fluoride. However, considering a problem of the ozone layer destruction, use of flon-alternative solvent such as perfluorocarbon has become a major issue. Still, even the flon-alternative solvent is sometimes questioned because that is regarded as a material causing the global warming.

Another problem with respect to the use of solvent is contamination of the lubricant layer. Diluted lubricant easily contains contaminants, resulting in that the contaminants are incorporated with the lubricant layer. The contaminants in the lubricant layer may cause many kinds of problems that: the magnetic head is corroded by ionized contaminants; the magnetic head is mechanically damaged by the protrusions formed on the surface of the lubricant layer; the magnetic head is chucked on the surface of the magnetic recording disk because the lubricity decreases. Contrarily, the method and the apparatus of the embodiments are free from these problems because of no use of the solvent.

Nevertheless, a small amount of solvent is occasionally used on such purpose as to make it easier to deal with the lubricant. As solvent, perfluoroalkyl, for example, HFE7300 or HFE7100 of 3M Corporation may be used. A quantity of the solvent is one volume percentage or below against the lubricant.

Next is described a magnetic disk manufacturing apparatus of the second embodiment of the invention.

Figure 15:
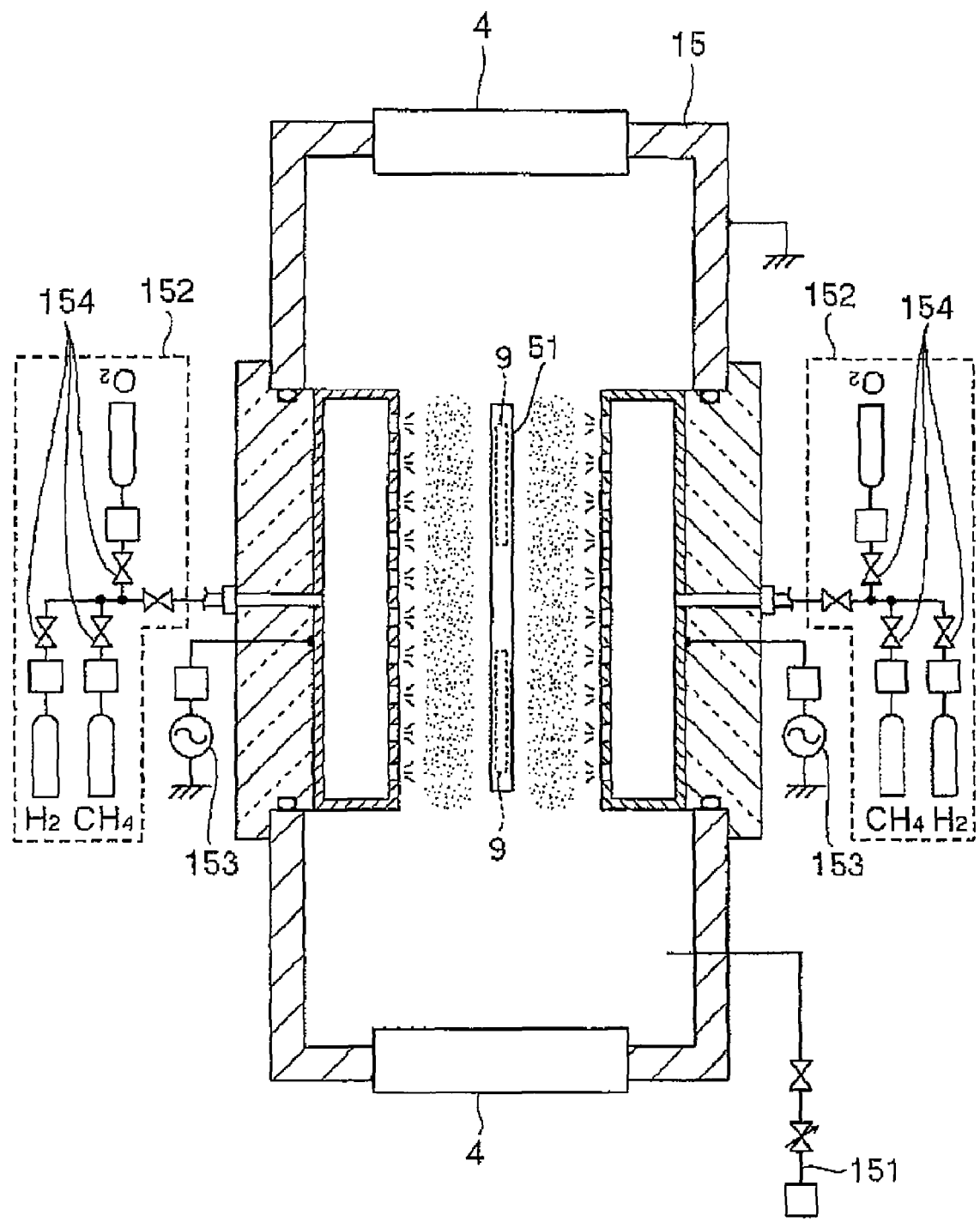
FIG. 15 shows a main part of a magnetic recording disk manufacturing apparatus of the second embodiment of the invention.

FIG. 15 shows a main part of the magnetic recording disk manufacturing apparatus of the second embodiment. The apparatus shown in FIG. 15 is different from the described first embodiment in the composition of the plasma-enhanced ashing to clean the substrate 9. Concretely, in the embodiment shown in FIG. 15, the ashing is carried out in the overcoat deposition chamber 15. FIG. 15 shows components on the overcoat deposition chamber 15.

The components on the overcoat deposition chamber 15 are nearly the same as those in FIG. 6, except the gas-introduction system 152. The gas-introduction 152 shown in FIG. 15 can introduce a gas mixture of carbon hydride and hydrogen, or an oxygen gas selectively to the overcoat chamber 15.

In FIG. 15, when an overcoat is deposited, a gas mixture of hydrocarbon and hydrogen is introduced. After the overcoat deposition, without moving the first substrate holder 51, the overcoat chamber 15 is pumped by the pumping system down to about $5 \times 10^{-2}$ Pa. Then, the introduced gas is switched to oxygen by opening and closing the valves 154. The ashing is carried out by the oxygen plasma in the same way as the described.

The embodiment shown in FIG. 15 has an advantage that it is enabled to remove the contaminants not only on the substrate 9 but also on the first substrate holder 51. If the contaminants remain on the first substrate holder 51, the contaminants may adhere to the next substrate 9 held by the first substrate holder next. The apparatus of this embodiment has an effect that the adhesion of the contaminants via the first substrate holder 51 is prevented in addition to the adhesion directly to the substrate 9. Moreover, it also possible to remove the contaminants adhering to exposed surfaces of the components in the overcoat chamber 15.

Figure 16:
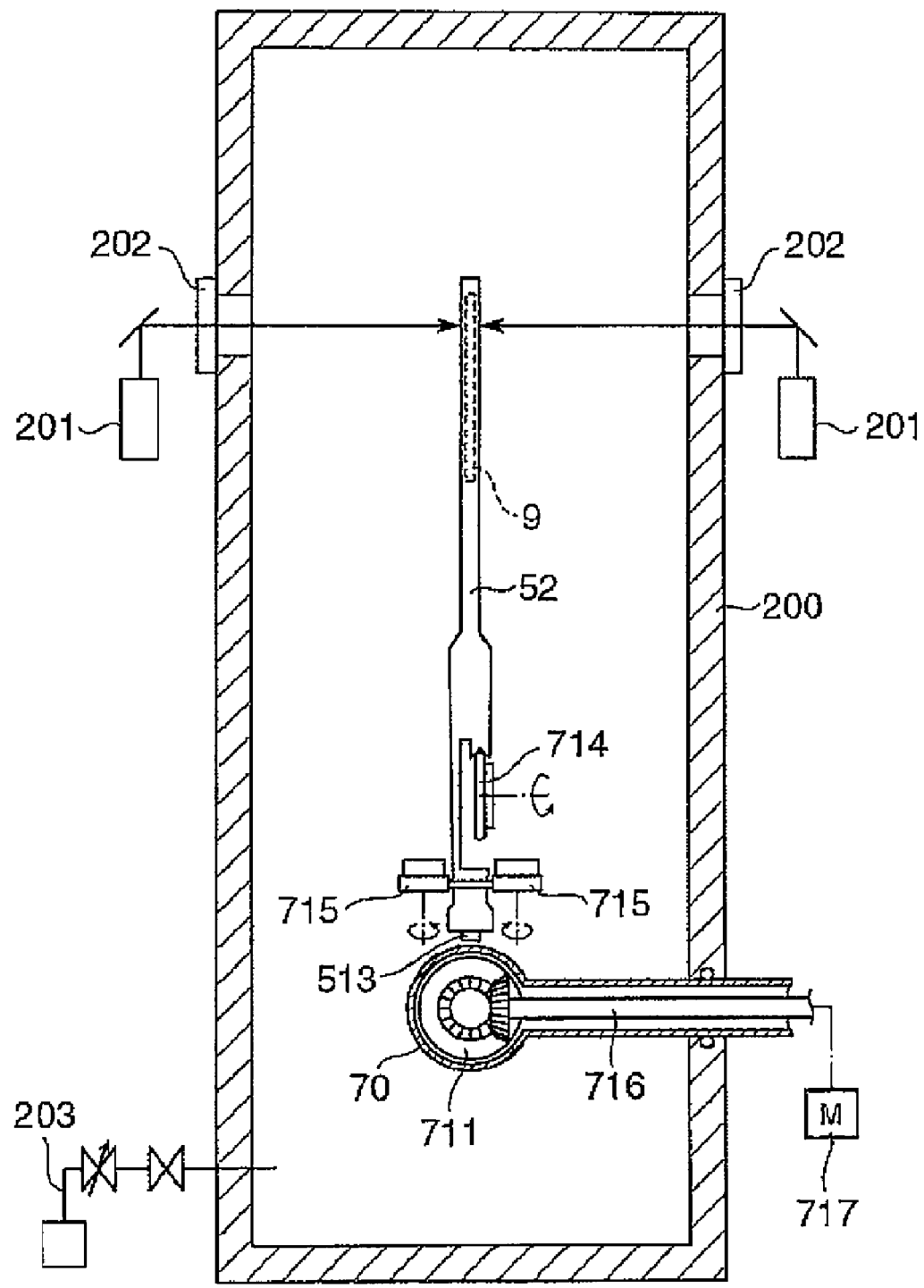
FIG. 16 shows a main part of a magnetic recording disk manufacturing apparatus of the third embodiment of the invention.

Next is described a magnetic disk manufacturing apparatus of the third embodiment of the invention. FIG. 16 shows a main part of the magnetic recording disk manufacturing apparatus of the third embodiment of the invention. The apparatus of the third embodiment has the feature that the third cleaning chamber 200 for cleaning the substrate 9 is added. The third cleaning chamber 200, for example, may be interposed between the second cleaning chamber 23 and the burnishing chamber 24 in the layout shown in FIG. 1. FIG. 16 shows a schematic side view of the third cleaning chamber 200.

In the third cleaning chamber 200 shown in FIG. 16, the substrate 9 is cleaned by laser irradiation. Concretely, the third cleaning chamber 200 comprises a laser oscillator 201, and an introduction window 202 for introducing laser beam into the chamber. The introduction window 202 is mounted airtightly shutting an opening formed on a wall of the third cleaning chamber 200.

The surface cleaning by laser irradiation is mainly conducted by ablation. When the laser beam is irradiated on the contaminants adhering to the substrate 9, the contaminants are rapidly decomposed by energy of the laser beam. The third cleaning chamber 200 comprises a pumping system 203 so that the laser irradiation cleaning can be carried out in vacuum.

TABLE 2 shows an example of condition of the cleaning by laser irradiation.

TABLE 2

Preferred Condition of the Laser Irradiation Cleaning

| Condition | Preferred range or value |
| --- | --- |
| Laser | Excimer laser |
| Wavelength | 248 nm |
| Irradiation energy density | 200 mJ/cm$^2$ or below |
| Irradiation type | Pulse (1-100 Hz) |
| The number of pulses | 100 or below |

If an irradiation energy density exceeds 200 mJ/cm2, there arises a possibility to erode the overcoat on the substrate 9. To carry out the cleaning without eroding the overcoat, a lower energy density, a lower frequency of the pulses or a smaller number of the pulses may be adopted. It is preferable to scan the laser beam in a radius direction of the substrate 9 while the substrate 9 is rotated so that the laser beam can be irradiated uniformly on the whole surface of the substrate 9. For this rotation, the same rotation mechanism as in the described embodiment may be employed.

Figure 17:
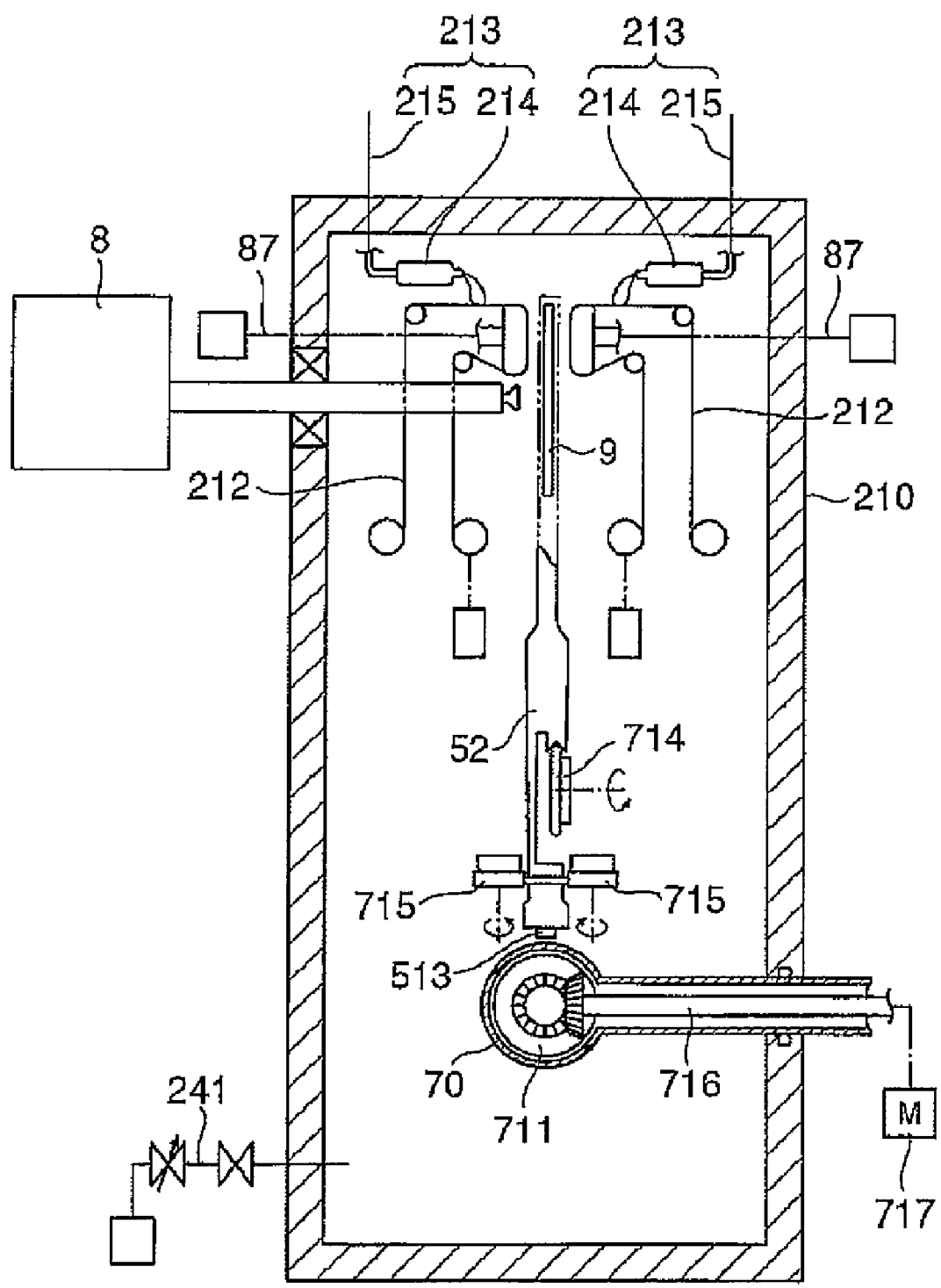
FIG. 17 shows a main part of a magnetic recording disk manufacturing apparatus of the fourth embodiment of the invention.

Next is described a magnetic disk manufacturing apparatus of the fourth embodiment of the invention. FIG. 17 shows a main part of the magnetic recording disk manufacturing apparatus of the fourth embodiment of the invention. A point characterizing this embodiment is that the burnishing and the lubricant-layer preparation are carried out in the same chamber. In other words, a burnishing-preparation chamber 210 is provided instead of the burnishing chamber 25 and the lubricant-layer preparation chamber 26 in the first embodiment.

FIG. 17 shows a schematic side view of the burnishing-preparation chamber 210. The burnishing-preparation chamber 210 comprises a pumping system 211 that discharges an air in the chamber, a rotation mechanism 8 that holds and rotates the substrate 9 around the axis coaxial with the substrate 9, a burnishing tape that is pressed against the substrate 9 being rotated by the rotation mechanism 8, and a lubricant coater 213 that coats lubricant on the substrate 9 simultaneously with the burnishing by a burnishing tape 212.

Description about the rotation mechanism 8 and the burnishing tape 212 are omitted because those are the same as in the described first embodiment. The lubricant coater 213 is mainly composed of an ejector 214 ejecting the lubricant from a tip thereof, a feeding tube 215 connected with the ejector 214, and a pump (not shown) that feeds the lubricant from a lubricant storing vessel (not shown) to the ejector 214 through the feeding tube 215. The lubricant coater 213 is provided at each side of the substrate location.

An operation of the burnishing-preparation chamber 210 is described.

In a state that the burnishing-preparation chamber 210 is pumped to obtain a specific vacuum pressure, the second substrate holder 52 holding the substrates 9 is moved into the burnishing-preparation chamber 210 and is stopped at a specific position. Then, the rotation mechanism 8 holds one of the substrates 9 and rotates it. During this rotation, the pressure members 247 at both sides of the substrate 9 are displaced toward the substrate 9 by a drive source (not shown), thereby pressing the burnishing tapes 212 against the substrate 9. As a result, the protrusions existing on the substrate 9 are removed.

Simultaneously, the lubricant coater 213 is operated. The lubricant is fed with the ejectors 214 by the pump through the feeding tubes 215. The lubricant is ejected from the ejectors 214 and poured onto the burnishing tapes 212. The lubricant poured on the burnishing tapes 212 is moved as the burnishing tapes 212 are moved. When the lubricant reaches a place where the burnishing tapes 212 are pressed against the substrate 9, the lubricant is thinly extended out between the burnishing tape 212 and the substrate 9. The extended lubricant adheres to the substrate 9. Thus, the lubricant is coated on the substrate 9.

The lubricant in this embodiment may be the same as in the described embodiment, whose main component is PEPE. The use of a small amount of the solvent is allowed as described. A space pressure in the burnishing-preparation chamber 210 and a pressure strength by the pressure members 247 may be the same as those in the described embodiment as well.

After the burnishing and the lubricant coating are simultaneously carried out on the whole surfaces of the substrate 9, the pressure members 247 are moved backward and the rotation by the rotation mechanism 8 is stopped. The second substrate holder 52 is moved to a position where the rotation mechanism 8 can hold the other substrate 9. As the rotation mechanism 8 rotates the other substrate 9, the burnishing and the lubricant coating are simultaneously carried out on the whole surfaces of the other substrate 9. Operations of the components except the burnishing-preparation chamber 210 are the same as those of the described first embodiment.

As understood from the above description, productivity in this embodiment is enhanced because the burnishing and the lubricant-layer preparation are simultaneously carried out in the burnishing-preparation chamber 210. Here, "simultaneously" includes the case that the burnishing and the lubricant-layer preparation are carried out literally at the same time, and the case that the burnishing and the lubricant-layer preparation are carried out roughly at the same time, exactly not the same time. The apparatus of this embodiment also has an advantage that the contaminants in the atmosphere cannot be incorporated with the lubricant layer because the burnishing and the lubricant-layer preparation are carried out in vacuum. Therefore, the apparatus contributes to manufacture of high-quality magnetic recording disks. The advantage that productivity is enhanced is still the same even when those are carried out in the atmosphere.

Carrying out the burnishing in vacuum and carrying out the lubricant-layer preparation in vacuum are closely related to each other. Though carrying out the burnishing in vacuum is much effective for the reduction of the contaminants, the burnishing possibly might be excessive because a friction force between the burnishing tape 212 and the substrate 9 is higher than that in the atmosphere. "Excessive" means a situation that not only the protrusions are removed, but the deposited overcoat is also scraped off. Contrarily, the raw lubricant generally has a high viscosity. If the lubricant may be diluted with the solvent, the coating can be made easier. However, the use of the solvent brings the described problems.

This embodiment has an advantage of solving these conflicting problems at once, that is, a 'killing two birds with one stone' solution. When the lubricant is coated on the substrate 9 via the burnishing tape 212, the lubricant coating is made easier even if a viscosity of the lubricant is high, in addition to that the excessive burnishing is prevented by the lubricant inserted between the burnishing tape 212 and the substrate 9.

Though the lubricant-layer preparation is carried out by pouting the lubricant on the burnishing tape 212 in this embodiment, the vapor deposition as in the first embodiment may be employed by providing pots 252 and heaters 253 as shown in FIG. 13 in the burnishing-preparation chamber 210.

The lubricant-layer preparation also may be carried out by a spraying method. Concretely, a sprayer is provided at each side of the substrate location in the burnishing-preparation chamber 210. Lubricant diluted with solvent is sprayed from the sprayers onto the substrate 9.

Figure 18:
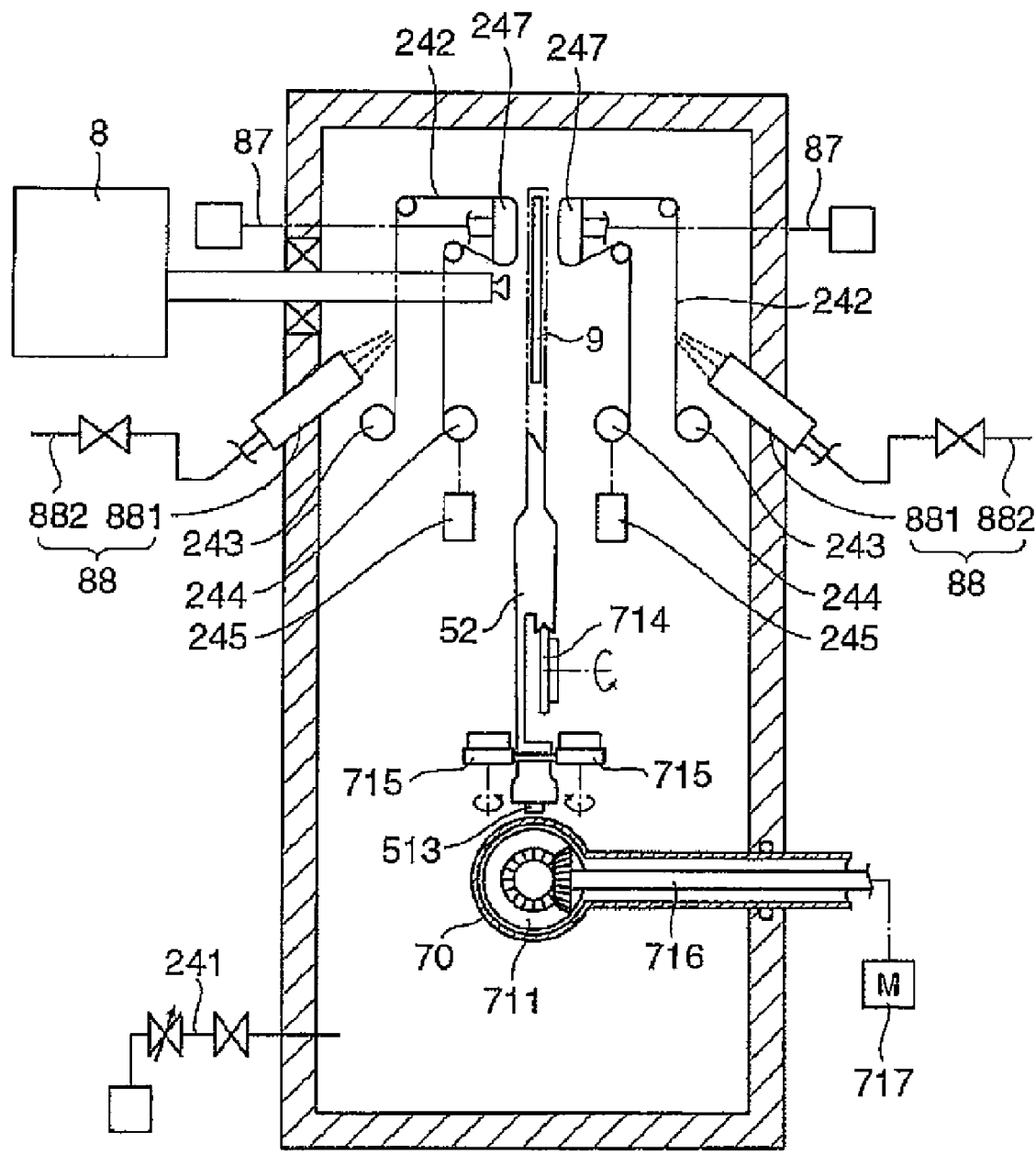
FIG. 18 shows a main part of a magnetic recording disk manufacturing apparatus of the fifth embodiment of the invention.
Figure 19:
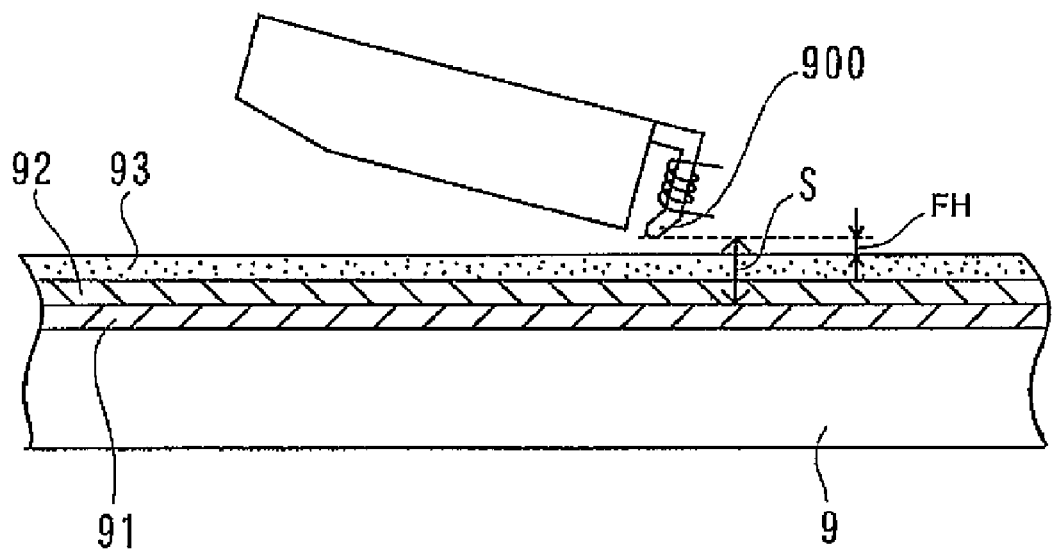
FIG. 19 shows a view explaining a spacing.

Next is described a magnetic disk manufacturing apparatus of the fifth embodiment of the invention. FIG. 18 shows a main part of the magnetic recording disk manufacturing apparatus of the fifth embodiment of the invention.

The fifth embodiment is different from the described first embodiment in the components on the burnishing chamber 24. In the fifth embodiment, a cleaning means 88 is provided. The cleaning means 88 cleans a surface of the burnishing tape 242 in vacuum prior to the burnishing.

A film containing oxygen ions or sulfuric ions, dusts, or organic substance such as fat and oil may adhere to the surface of the burnishing tape 242 as contaminants. If the burnishing is carried out in a state that such contaminants adhere to the surface of the burnishing tape 242, the contaminants may transfer to the substrate 9.

Considering this, the surface of the burnishing tape 242 is cleaned by the cleaning means 86 prior to the burnishing in this embodiment. Concretely, the cleaning means 88 is mainly composed of an ion-beam source 881 provided in the burnishing chamber 24, and a gas supply system 882 that supplies a material gas with the ion-beam source 881.

The gas supply system 882 supplies an argon gas or an oxygen gas. The ion-beam source 881 irradiates beam of argon ion or oxygen ion onto the burnishing tape 242. Acceleration energy of the ion beam is preferably 250-600 eV. An incident angle of the ion beam onto to the burnishing tape 242 is preferably 30-40 degrees. If the burnishing tape 242 may be damaged by the ion beam, the acceleration energy is made lower, or the incident angle is made smaller.

An irradiation pattern of the ion beam is a rectangle whose width is the same as the burnishing tape 242 or slightly larger, and whose length is about 30 mm. The ion-beam source 881 has a focusing electrode, which focuses the ion beam so that this irradiation pattern can be obtained.

The incident ion beam onto the burnishing tape 242 bombards or scrapes the contaminants existing on the surface of the burnishing tape 242, thereby removing them. As a result, the surface of the burnishing tape 242 is cleaned. The burnishing is carried out by pressing the cleaned surface of the burnishing tape 242 onto the substrate 9. Therefore, the contaminants are prevented from adhering to the substrate 9.

Though the surface of the burnishing tape 242 is cleaned by the ion beam in this embodiment, it is possible to clean it by plasma or laser. It is also possible to clean the surface of the burnishing tape 242 using the method in the fourth embodiment.

Next is described about an in-line type substrate processing apparatus of an embodiment of the invention. The magnetic-recording disk manufacturing apparatus shown in FIG. 1 is concurrently an in-line type substrate processing apparatus.

The apparatus comprises a plurality of vacuum chambers 10-17, 20-29 connected along two circumventive transfer paths 1, 2, and the shifting robot 63 that transfers the substrate 9 in vacuum without exposing the substrate 9 to the atmosphere along the third transfer path 3 that interconnects the first path 1 and the second path 2.

The described structure is a kind of circumventive in-line type apparatus. U.S. Pat. No. 5,846,328 discloses the same kind of apparatus. This type of apparatus has a merit that the substrate holder does not bring contaminants in the atmosphere into the apparatus because the substrate holder is not taken out to the atmosphere. However, if it is intended to provide more vacuum chambers in such a kind of in-line type apparatus, a transfer path with a longer length is required. As imagined from FIG. 1, if the transfer path is longer, a space surrounded by the transfer path is larger. This space is not essential for the substrate processing. If whole occupation space of the apparatus increases with an increase in such a non-essential space, it is not a preferable result.

Contrarily, by providing additional vacuum chambers along another circumventive transfer path as in the apparatus of this embodiment, the number of vacuum chambers can be increased without much increase in the whole occupation space of the apparatus. Therefore, this solution is very much suitable for the case that a larger number of processes are intended to carry out without breaking vacuum.

An application of the idea of such an in-line type substrate processing apparatus is not limited to the described manufacture of magnetic recording disks. For example, the idea can be applied to manufacture of optical information recording media such as a compact disc, and manufacture of display devices such as a liquid crystal display, as far as the in-line type apparatus is used.

The circumventive transfer path may have another shape than a rectangle. For example, the circumventive transfer path may have a shape of a triangle, a circle, a pentagon, or the like. This invention is not limited to the use of the substrate holder that holds two substrates simultaneously. It is possible to employ a substrate holder that holds only one substrate, or holds three or more substrates simultaneously.

The magnetic-recording disk manufacturing apparatus of the invention is not limited to the described in-line type. For example, the invention includes a cluster-tool type apparatus where process chambers, a load lock chamber and an unload lock chamber are provided around a transfer chamber in which a transfer robot is provided.

The term "magnetic-recording disk manufacturing apparatus" generally means an apparatus for manufacturing a magnetic recording disk. Therefore, it includes an apparatus with which all processes for manufacturing a magnetic recording disk are carried out, and an apparatus with which not all processes are carried out.

The term "magnetic recording disk" means a disk where information is recorded utilizing an effect of magnetism in general. Therefore, it includes a disk utilizing another effect than magnetism in addition to the magnetism, such as a magneto-optical recording disk.

What is claimed is:

1. An in-line type substrate processing apparatus, comprising:
   a first polygonal circulation path endlessly surrounding an area;
   a first group of vacuum chambers provided along the first polygonal circulation path, at least one of the vacuum chambers being a process chamber for processing a substrate under vacuum;

a first circulation mechanism for circulating a first holder along the first polygonal circulation path through the first group of the vacuum chambers;

a second polygonal circulation path endlessly surrounding another area;

a second group of vacuum chambers provided along the second polygonal circulation path, at least one of the vacuum chambers being a process chamber for processing the substrate under vacuum;

a second circulation mechanism for circulating a second holder along the second polygonal circulation path through the second group of the vacuum chambers;

a loading mechanism for loading the substrate on the first holder so that the substrate is processed in the process chamber on the first polygonal circulation path;

a connection transfer path interconnecting the first and the second polygonal circulation paths, such that a side in the first polygonal circulation path and a side in the second polygonal circulation path face each other;

an unloading mechanism for unloading the substrate from the second holder after the substrate is processed in the process chamber on the second polygonal circulation path;

a vacuum chamber on the connection transfer path; and one robot provided in the vacuum chamber on the connection transfer path, the vacuum chamber on the connection transfer path air-tightly interconnecting one of the vacuum chambers of the first group on the side in the first polygonal circulation path and one of the vacuum chambers of the second group on the side in the second polygonal circulation path, the one robot comprising an arm capable of picking up the substrate from the first holder on the first polygonal circulation path and capable of placing the substrate on the second holder on the second polygonal circulation path so that the substrate is processed in the process chamber on the second polygonal circulation path after the substrate is processed in the process chamber on the first polygonal circulation path, wherein the substrate is capable of being picked up from the first holder on the first polygonal circulation path and placed on the second holder only by the one robot.

2. An in-line type substrate processing apparatus, comprising:

a first polygonal circulation path endlessly surrounding an area;

a first group of vacuum chambers provided along the first polygonal circulation path, at least one of the vacuum chambers being a process chamber for processing a substrate under vacuum;

a first circulation mechanism for circulating a first holder along the first polygonal circulation path through the first group of the vacuum chambers;

a second polygonal circulation path endlessly surrounding another area;

a second group of vacuum chambers provided along the second polygonal circulation path, at least one of the vacuum chambers being a process chamber for processing the substrate under vacuum;

a second circulation mechanism for circulating a second holder along the second polygonal circulation path through the second group of the vacuum chambers;

a loading mechanism for loading the substrate on the first holder so that the substrate is processed in the process chamber on the first polygonal circulation path;

a connection transfer path interconnecting one side in the first and the second polygonal circulation paths, such that the side in the first polygonal circulation path and the side in the second polygonal circulation path face each other;

an unloading mechanism for unloading the substrate from the second holder after the substrate is processed in the process chamber on the second polygonal circulation path;

a vacuum chamber on the connection transfer path; and one robot provided in the vacuum chamber on the connection transfer path, the vacuum chamber on the connection transfer path air-tightly interconnecting one of the vacuum chambers of the first group on the side in the first polygonal circulation path and one of the vacuum chambers of the second group on the side in the second polygonal circulation path, a position on the side in the first polygonal circulation path and a position on the side in the second polygonal circulation path being located within an operational area of the one robot in the vacuum chamber on the connection transfer path, the one robot comprising an arm capable of picking up the substrate from the first holder at the position on the side in the first polygonal circulation path and capable of placing the substrate on the second holder at the position on the side in the second polygonal circulation path so that the substrate is processed in the process chamber on the second polygonal circulation path after the substrate is processed in the process chamber on the first polygonal circulation path, the first circulation mechanism moving the first holder from the position on the side in the first polygonal circulation path to the loading mechanism without holding the substrate, and the second circulation mechanism moving the second holder from the unloading mechanism to the position on the side in the second polygonal circulation path without holding the substrate.

3. An in-line type substrate processing apparatus as claimed in claim 2, wherein the vacuum chambers provided along the first polygonal circulation path are connected air-tightly to each other, and the vacuum chambers provided along the second polygonal circulation path are connected air-tightly to each other.

4. An in-line type substrate processing apparatus as claimed in claim 2, wherein the first and the second polygonal circulation paths are rectangular.

5. An in-line type substrate processing apparatus as claimed in claim 2, wherein, one of the vacuum chambers of the first group is a load lock chamber which is opened to the atmosphere when the substrate is transferred into and loaded on the first holder by the loading mechanism, and one of the vacuum chamber chambers of the second group is an unload lock chamber which is opened to the atmosphere when the substrate unloaded from the second holder by the unloading mechanism is transferred out.

6. An in-line type substrate processing apparatus as claimed in claim 2, wherein, the first circulation mechanism includes couples of members magnetically coupled through walls of the vacuum chambers to introduce a driving force through the walls to move the first holder.

7. An in-line type substrate processing apparatus as claimed in claim 2, wherein, the second circulation mechanism includes couples of members magnetically coupled through walls of the vacuum chambers to introduce a driving force through the walls to move the second holder.

8. An in-line type substrate processing apparatus as claimed in claim 2, wherein the substrate is capable of being picked up from the first holder on the first circulation path and placed on the second holder only by the one robot.

* * * * *